(12) United States Patent
Shih et al.

(10) Patent No.: US 10,332,757 B2
(45) Date of Patent: Jun. 25, 2019

(54) SEMICONDUCTOR DEVICE PACKAGE HAVING A MULTI-PORTION CONNECTION ELEMENT

(71) Applicant: Advanced Semiconductor Engineering, Inc., Kaohsiung (TW)

(72) Inventors: Yu-Lin Shih, Kaohsiung (TW); Chih Cheng Lee, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/824,919

(22) Filed: Nov. 28, 2017

(65) Prior Publication Data

US 2019/0164782 A1 May 30, 2019

(51) Int. Cl.
| | | |
|---|---|---|
| H01L 23/49 | (2006.01) | |
| H01L 25/00 | (2006.01) | |
| H01L 21/48 | (2006.01) | |
| H01L 23/498 | (2006.01) | |
| H01L 23/00 | (2006.01) | |
| H01L 25/065 | (2006.01) | |

(52) U.S. Cl.
CPC ...... *H01L 21/4857* (2013.01); *H01L 21/4853* (2013.01); *H01L 23/49811* (2013.01); *H01L 23/49822* (2013.01); *H01L 23/49838* (2013.01); *H01L 24/11* (2013.01); *H01L 25/0657* (2013.01); H01L 2224/1146 (2013.01); H01L 2225/06517 (2013.01); H01L 2225/06548 (2013.01); H01L 2924/181 (2013.01)

(58) Field of Classification Search
CPC ......... H01L 23/49811; H01L 23/49822; H01L 23/49838; H01L 24/11; H01L 25/0657
See application file for complete search history.

(56) References Cited

U.S. PATENT DOCUMENTS

| | | | | |
|---|---|---|---|---|
| 6,362,525 B1* | 3/2002 | Rahim | ............. | H01L 23/49838 257/528 |
| 7,190,078 B2* | 3/2007 | Khandekar | .......... | H01L 21/486 257/621 |
| 7,271,072 B2* | 9/2007 | Graettinger | ......... | H01L 21/7687 257/E21.008 |
| 8,421,227 B2* | 4/2013 | Lin | ................... | H01L 23/53238 257/734 |
| 8,587,120 B2* | 11/2013 | Choi | .................. | H01L 23/3171 257/737 |
| 8,975,111 B2* | 3/2015 | Lin | ..................... | H01L 21/6835 438/55 |
| 9,905,508 B2* | 2/2018 | Su | ....................... | H01L 23/4985 |

(Continued)

*Primary Examiner* — Ida M Soward
(74) *Attorney, Agent, or Firm* — Foley & Lardner LLP; Cliff Z. Liu

(57) ABSTRACT

A semiconductor substrate includes a dielectric layer, a first patterned conductive layer and a first connection element. The dielectric layer has a first surface. The first patterned conductive layer has a first surface and is disposed adjacent to the first surface of the dielectric layer. The first connection element is disposed on the first surface of the first patterned conductive layer. The first connection element includes a first portion, a second portion and a seed layer disposed between the first portion and the second portion. The first portion of the first connection element and the first patterned conductive layer are formed to be a monolithic structure.

20 Claims, 19 Drawing Sheets

(56) References Cited

U.S. PATENT DOCUMENTS

| | | | |
|---|---|---|---|
| 10,032,705 B2* | 7/2018 | Lee | H01L 23/49838 |
| 2010/0099254 A1* | 4/2010 | Narushima | C23C 16/44 |
| | | | 438/668 |
| 2011/0210441 A1* | 9/2011 | Lee | H01L 23/3128 |
| | | | 257/737 |
| 2012/0267800 A1* | 10/2012 | Lin | H01L 21/4857 |
| | | | 257/777 |
| 2012/0279630 A1* | 11/2012 | Chuang | H05K 3/0097 |
| | | | 156/48 |
| 2015/0380391 A1* | 12/2015 | Ha Woo | H05K 3/0017 |
| | | | 257/686 |
| 2016/0056087 A1* | 2/2016 | Wu | H01L 21/486 |
| | | | 257/738 |
| 2016/0148888 A1* | 5/2016 | Ryu | H01L 24/14 |
| | | | 257/621 |
| 2016/0379950 A1 | 12/2016 | Tsai et al. | |
| 2018/0151495 A1* | 5/2018 | Hsu | H01L 23/5283 |
| 2018/0166370 A1* | 6/2018 | Lin | H01L 23/49822 |
| 2018/0174954 A1* | 6/2018 | Lu | H01L 23/49838 |

\* cited by examiner

US 10,332,757 B2

SEMICONDUCTOR DEVICE PACKAGE HAVING A MULTI-PORTION CONNECTION ELEMENT

BACKGROUND

1. Technical Field

The present disclosure relates to a semiconductor device package and a method of manufacturing the same, and to a semiconductor device package including an improved semiconductor substrate.

2. Description of the Related Art

A semiconductor device package may include a substrate including connection elements (e.g. conductive posts, bumps, pillar or the like) for external connection. It may be desirable for the connection elements to have a same height to ensure a reliable external connection. However, a difference between the connection elements in height may occur during manufacture due to plating conditions (e.g. plating solution, plating time, plating current, or other plating conditions) and/or a pattern or layout of the conductive elements, which may adversely affect reliability of the semiconductor device package.

SUMMARY

In one or more embodiments, a semiconductor substrate includes a dielectric layer, a first patterned conductive layer and a first connection element. The dielectric layer has a first surface. The first patterned conductive layer has a first surface and is disposed adjacent to the first surface of the dielectric layer. The first connection element is disposed on the first surface of the first patterned conductive layer. The first connection element comprises a first portion, a second portion and a seed layer disposed between the first portion and the second portion. The first portion of the first connection element and the first patterned conductive layer are formed to be a monolithic structure.

In one or more embodiments, a semiconductor package structure includes a substrate and a first chip. The substrate includes a dielectric layer, a first patterned conductive layer and a first connection element. The dielectric layer has a first surface. The first patterned conductive layer has a first surface and is disposed adjacent to the first surface of the dielectric layer. The first connection element is disposed on the first surface of the first patterned conductive layer. The first connection element comprises a first portion, a second portion and a seed layer disposed between the first portion and the second portion. The first portion of the first connection element and the first patterned conductive layer are formed to be a monolithic structure. The first chip has an active surface and is disposed on the substrate. The active surface faces the substrate and is electrically connected to the first connection element.

In one or more embodiments, a method for manufacturing a semiconductor substrate includes providing a carrier; forming a first patterned photo resist layer on the carrier, the first patterned photo resist layer defining a first opening; forming a second patterned photo resist layer on the carrier, the second patterned photo resist layer defining a second opening; respectively performing a first plating operation and a second plating operation in the first opening and second opening to form a patterned conductive layer and a connection element, wherein the connection element comprises a first portion, a second portion and a seed layer disposed between the first portion and the second portion; and removing the carrier and the second patterned photo resist layer to expose a top surface of the connection element and a portion of a side wall of the connection element.

BRIEF DESCRIPTION OF THE DRAWINGS

Common reference numerals are used throughout the drawings and the detailed description to indicate the same or similar elements. Embodiments of the present disclosure will be readily understood from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1:
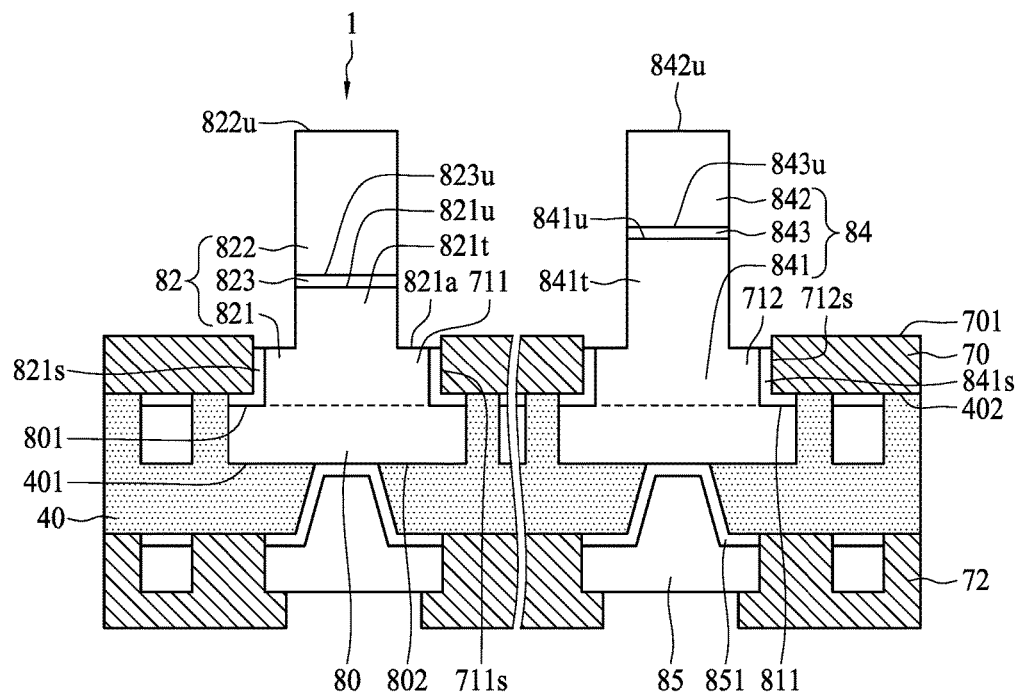
FIG. 1 is a cross-sectional view of a semiconductor substrate in accordance with one or more embodiments of the present disclosure.

FIG. 1 is a cross-sectional view of a semiconductor substrate 1 in accordance with one or more embodiments of the present disclosure. The semiconductor substrate 1 includes a dielectric layer 40, patterned conductive layers 80 and 85, connection elements 82 and 84 and protection layers 70 and 72. In some embodiments, the dielectric layer 40 includes a suitable insulating material. In some embodiments, the patterned conductive layers 80 and 85 and the connection element 84 and 82 may include, for example, copper (Cu), another metal, a metal alloy, or other conductive material. In some embodiments, the protection layers 70 and 72 may be solder mask layers.

The dielectric layer 40 has a surface 401 and a surface 402. The patterned conductive layer 80 has a surface 801 and a surface 811. The patterned conductive layer 80 is disposed on the surface 401 of the dielectric layer 40. The connection element 82 is disposed on the surface 801 (e.g. along the dotted line shown in FIG. 1) of the patterned conductive layer 80. The connection element 84 is disposed on the surface 811 (e.g. along the dotted line shown in FIG. 1) of the patterned conductive layer 80. The connection element 82 includes a first portion 821, a second portion 822 and a seed layer 823 disposed between the first portion 821 and the second portion 822. The first portion 821 of the connection element 82 and the patterned conductive layer 80 are formed to be a monolithic structure (e.g. may be formed integrally without an interface or boundary in between). In some embodiments, a height of the connection element 82 is greater than about 100 micrometers (μm) (e.g. may be about 110 μm or greater, about 120 μm or greater, or about 130 μm or greater). In some embodiments, a height of the connection element 84 is greater than about 100 μm (e.g. may be about 110 μm or greater, about 120 μm or greater, or about 130 μm or greater). In some embodiments, a length of a pitch between the connection element 82 and the connection element 84 ranges from about 150 μm to about 200 μm.

The connection element 84 is disposed on the surface 811 of the patterned conductive layer 80. The connection element 84 includes a first portion 841, a second portion 842 and a seed layer 843 disposed between the first portion 841 and the second portion 842. The first portion 841 of the connection element 84 and the patterned conductive layer 80 are formed to be a monolithic structure. The connection element 82 has a top surface 822u and the connection element 84 has a top surface 842u. The second portion 822 of the connection element 82 and the second portion 842 of the connection element 84 protrude from the surface 402 of the dielectric layer 40. The top surface 822u of the connection element 82 is substantially coplanar with the top surface 842u of the connection element 84.

The first portion 821 of the connection element 82 has a first top surface 821u and the first portion 841 of the connection element 84 has a first top surface 841u. The seed layer 823 of the connection element 82 has a top surface 823u and the seed layer 843 of the connection element 84 has a top surface 843u. The first portion 821 of the connection element 82 and the first portion 841 of the connection element 84 protrude from the surface 402 of the dielectric layer 40. The first top surface 821u of the first portion 821 of the connection element 82 is not coplanar with the first top surface 841u of the first portion 841 of the connection element 84. A height of the second portion 822 of the connection element 82 is different from a height of the second portion 842 of the connection element 84 (e.g. is larger than about 1.1 times the height of the second portion 842, is larger than about 1.2 times the height of the second portion 842, or is larger than about 1.3 times the height of the second portion 842, or is smaller than about 0.9 times the height of the second portion 842, is smaller than about 0.8 times the height of the second portion 842, or is smaller than about 0.7 times the height of the second portion 842).

The first portion 821 of the connection element 82 includes a protrusion 821t. A width of the protrusion 821t is substantially the same as a width of the second portion 822 of the connection element 82. A height of the protrusion 821t of the first portion 821 of the connection element 82 is less than the width of the protrusion 821t of the first portion 821 of the connection element 82 (e.g. is less than about 0.9 times the width of the protrusion 821t, is less than about 0.8 times the width of the protrusion 821t, or is less than about 0.7 times the width of the protrusion 821t). The protection layer 70 is disposed on the surface 801 of the patterned conductive layer 80. The protection layer 70 defines an opening 711 corresponding to the connection element 82. A side wall 711s of the opening 711 of the protection layer 70 surrounds a portion of the connection element 82. The protection layer 70 defines an opening 712 corresponding to the connection element 84. A side wall 712s of the opening 712 of the protection layer 70 surrounds a portion of the connection element 84. A height of the protrusion 821t of the first portion 821 of the connection element 82 may be less than a maximum width of the first portion 821 of the connection element 82 (e.g. is less than about 0.9 times the maximum width of the first portion 821, is less than about 0.8 times the maximum width of the first portion 821, or is less than about 0.7 times the maximum width of the first portion 821). This can help to prevent voids in the connection elements 82 from occurring during manufacture. A height of the protrusion 841t of the first portion 841 of the connection element 84 may be less than a maximum width of the first portion 841 of the connection element 84 (e.g. is less than about 0.9 times the maximum width of the first portion 841, is less than about 0.8 times the maximum width of the first portion 841, or is less than about 0.7 times the maximum width of the first portion 841). This can help to prevent voids in the connection elements 84 from occurring during manufacture.

The seed layer 823 provides a relatively large plating area during a second plating operation (e.g. for forming the second portion 822 of the connection element 82). The seed layer 823 may compensate for a height difference between portions of the connection elements 82 and 84, thus providing for a substantially same height for the connection elements 82 and 84. In addition, the second plating operation can implement a plating solution including levelers and/or brighteners, which may compensate for the height difference between portions of the connection elements 82 and 84.

The connection element 82 includes a seed layer 821s between the side wall 711s of the opening 711 of the protection layer 70 and the first portion 821 of the first connection element 82. The connection element 84 includes a seed layer 841s between the side wall 712s of the opening 712 of the protection layer 70 and the first portion 841 of the first connection element 84. The seed layers 821s and 841s are lower than, or recessed from, the top surface 701 of the protection layer 70.

The first portion 821 of the connection element 82 has a second top surface 821a. The second top surface 821a of the first portion 821 of the connection element 82 is lower than, or recessed from, the first top surface 821u of the first portion 821 of the connection element 82 (the latter of which may correspond to the protrusion 821t). The second top surface 821a of the first portion 821 of the connection element 82 is not coplanar with the top surface 701 of the protection layer 70. In some embodiments, the first portion 821, the second portion 822 and the seed layers 821s, 823, as well as a seed layer 851 (described in more detail below) may include, for example, Cu, another metal, a metal alloy, or other conductive material. In some embodiments, the first portion 841, the second portion 842 and the seed layer 841s and 843 may include, for example, Cu, another metal, a metal alloy, or other conductive material. In some embodiments, a distance between the second top surface 821a of the first portion 821 of the connection element 82 and the first top surface 821u of the first portion 821 of the connection element 82 ranges from 0 μm to about 50 μm.

Figure 2:
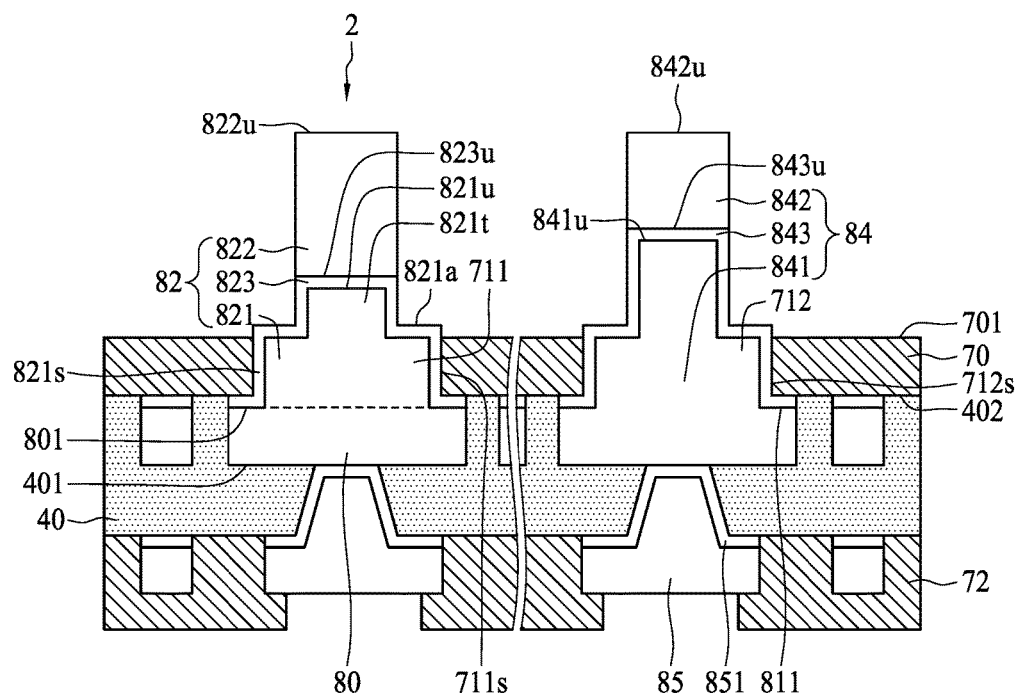
FIG. 2 is a cross-sectional view of a semiconductor substrate in accordance with one or more embodiments of the present disclosure.

FIG. 2 is a cross-sectional view of a semiconductor substrate 2 in accordance with one or more embodiments of the present disclosure. The semiconductor substrate 2 is similar to the semiconductor substrate 1 shown in FIG. 1, and some same-numbered components are not described again with respect to FIG. 2. The semiconductor substrate 2 includes a dielectric layer 40, patterned conductive layers 80 and 85, connection elements 82 and 84 and protection layers 70 and 72. In some embodiments, the patterned conductive layers 80 and 85 and the connection element 84 and 82 may include, for example, Cu, another metal, a metal alloy, or other conductive material. In some embodiments, the protection layers 70 and 72 may be solder mask layers.

The connection element 82 includes a first portion 821, a second portion 822 and a seed layer 823 disposed between the first portion 821 and the second portion 822. The connection element 84 includes a first portion 841, a second portion 842 and a seed layer 843 disposed between the first portion 841 and the second portion 842. The first portion 821 of the connection element 82 and the patterned conductive layer 80 are formed to be a monolithic structure.

The top surface 701 of the protection layer 70 is lower than the second top surface 821a of the first portion 821 of the connection element 82. The seed layer 823 and the seed layer 821s may be formed continuously, and form a continuous layer. In some embodiments, the seed layer 823 and the seed layer 821s may include, for example, Cu, another metal, a metal alloy, or other conductive material. The connection element 82 is disposed on the surface 801 (along the dotted line shown in FIG. 2) of the patterned conductive layer 80. The connection element 84 is disposed on the surface 811 (along the dotted line shown in FIG. 2) of the patterned conductive layer 80. The first top surface 821u of the first portion 821 of the connection element 82 is not coplanar with the first top surface 841u of the first portion 841 of the connection element 84. A height of the second portion 822 of the connection element 82 is different from a height of the second portion 842 of the connection element 84 (e.g. is larger than about 1.1 times the height of the second portion 842, is larger than about 1.2 times the height of the second portion 842, or is larger than about 1.3 times the height of the second portion 842, or is smaller than about 0.9 times the height of the second portion 842, is smaller than about 0.8 times the height of the second portion 842, or is smaller than about 0.7 times the height of the second portion 842). The first portion 821 of the connection element 82 includes a protrusion 821t. A width of the protrusion 821t is substantially the same as a width of the second portion 822 of the connection element 82. A height of the protrusion 821t of the first portion 821 of the connection element 82 is less than the width of the protrusion 821t of the first portion 821 of the connection element 82 (e.g. is less than about 0.9 times the width of the protrusion 821t, is less than about 0.8 times the width of the protrusion 821t, or is less than about 0.7 times the width of the protrusion 821t).

The top surface 822u of the connection element 82 and the top surface 842u of the connection element 84 are substantially coplanar with one another. In some embodiments, a height of the connection element 82 is greater than about 100 μm (e.g. may be about 110 μm or greater, about 120 μm or greater, or about 130 μm or greater). In some embodiments, a height of the connection element 84 is greater than about 100 μm (e.g. may be about 110 μm or greater, about 120 μm or greater, or about 130 μm or greater). In some embodiments, a length of a pitch between the connection element 82 and the connection element 84 ranges from about 150 μm to about 200 μm.

Figure 3:
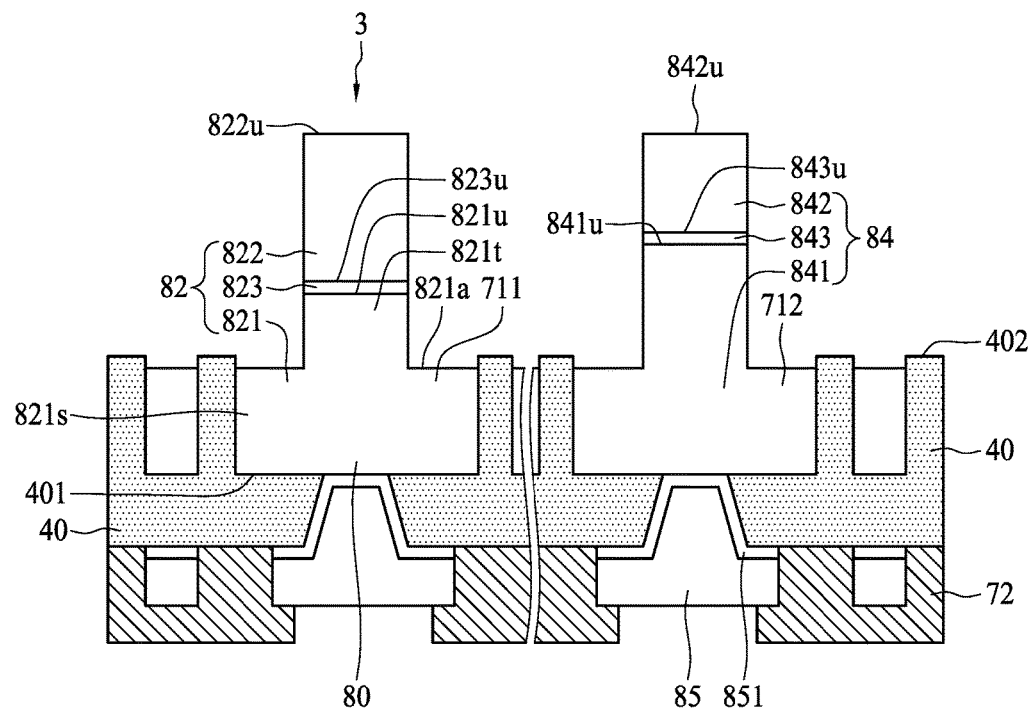
FIG. 3 is a cross-sectional view of a semiconductor substrate in accordance with one or more embodiments of the present disclosure.

FIG. 3 is a cross-sectional view of a semiconductor substrate 3 in accordance with one or more embodiments of the present disclosure. The semiconductor substrate 3 is similar to the semiconductor substrate 1 shown in FIG. 1, and some same-numbered components are not described again with respect to FIG. 3. The semiconductor substrate 3 includes a dielectric layer 40, patterned conductive layers 80 and 85, connection elements 82 and 84 and a protection layer 72. In some embodiments, the patterned conductive layers 80 and 85 and the connection element 84 and 82 may include, for example, Cu, another metal, a metal alloy, or other conductive material. In some embodiments, the protection layer 72 may be a solder mask layer.

The connection element 82 includes a first portion 821, a second portion 822 and a seed layer 823 disposed between the first portion 821 and the second portion 822. The connection element 84 includes a first portion 841, a second portion 842 and a seed layer 843 disposed between the first portion 841 and the second portion 842. The first portion 821 of the connection element 82 and the patterned conductive layer 80 are formed to be a monolithic structure. The first portion 841 of the connection element 84 and the patterned conductive layer 80 are formed to be a monolithic structure. The semiconductor substrate 3 does not include the protection layer 70. The second top surface 821a of the first portion 821 of the connection element 82 is lower than the surface 402 of the dielectric layer 40. The top surface 822u of the connection element 82 is substantially coplanar with the top surface 842u of the connection element 84.

Figure 4:
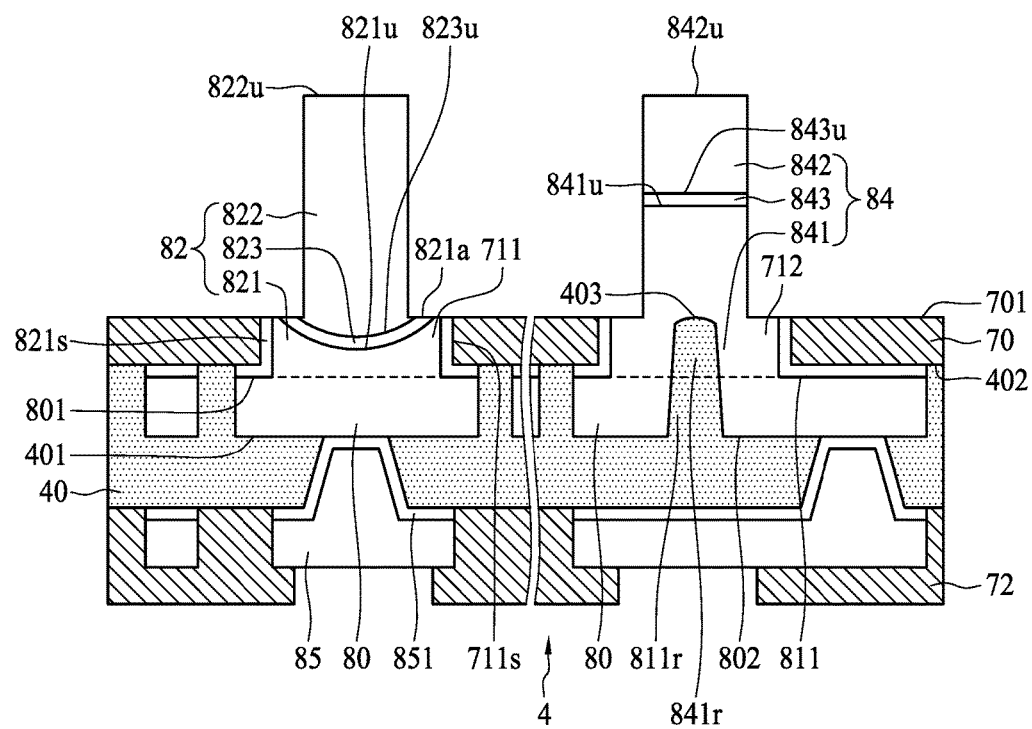
FIG. 4 is a cross-sectional view of a semiconductor substrate in accordance with one or more embodiments of the present disclosure.

FIG. 4 is a cross-sectional view of a semiconductor substrate 4 in accordance with one or more embodiments of the present disclosure. The semiconductor substrate 4 is similar to the semiconductor substrate 1 shown in FIG. 1, and some same-numbered components are not described again with respect to FIG. 4. The semiconductor substrate 4 includes a dielectric layer 40, patterned conductive layers 80 and 85, connection elements 82 and 84 and protection layers 70 and 72. In some embodiments, the patterned conductive layers 80 and 85 and the connection element 84 and 82 may include, for example, Cu, another metal, a metal alloy, or other conductive material. In some embodiments, the protection layers 70 and 72 may be solder mask layers.

The dielectric layer 40 has a surface 401, a surface 402 and a surface 403. The patterned conductive layer 80 has a surface 801 and a surface 811. The patterned conductive layer 80 is disposed on the surface 401 of the dielectric layer 40. The connection element 82 is disposed on the surface 801 (along the dotted line shown in FIG. 4) of the patterned conductive layer 80. The connection element 84 is disposed on the surface 811 (along the dotted line shown in FIG. 4) of the patterned conductive layer 80.

The connection element 82 includes a first portion 821, a second portion 822 and a seed layer 823 disposed between the first portion 821 and the second portion 822. The first portion 821 of the connection element 82 and the patterned conductive layer 80 are formed to be a monolithic structure. In some embodiments, a height of the connection element 82 is greater than about 100 μm (e.g. may be about 110 μm or greater, about 120 μm or greater, or about 130 μm or greater). In some embodiments, a height of the connection element 84 is greater than about 100 μm (e.g. may be about 110 µm or greater, about 120 µm or greater, or about 130 µm or greater). In some embodiments, a length of a pitch between the connection element 82 and the connection element 84 ranges from about 150 µm to about 200 µm.

The connection element 84 is disposed on the surface 811 of the patterned conductive layer 80. The connection element 84 includes a first portion 841, a second portion 842 and a seed layer 843 disposed between the first portion 841 and the second portion 842. The first portion 841 of the connection element 84 and the patterned conductive layer 80 are formed to be a monolithic structure. The connection element 82 has a top surface 822u and the connection element 84 has a top surface 842u. The top surface 822u and the top surface 842u are substantially coplanar with one another. The patterned conductive layer 80 includes a surface 802 opposite to the surface 801 of the patterned conductive layer 80. A recess 811r is recessed in the surface 802 of the patterned conductive layer 80. A portion of the dielectric layer 40 is disposed in the recess 811r. The surface 403 of the dielectric layer 40 may be disposed in the recess 811r, and may be curved. The first portion 821 of the connection element 82 has a first top surface 821u and the first portion 841 of the connection element 84 has a first top surface 841u. The first top surface 821u of the first portion 821 of the connection element 82 is not coplanar with the first top surface 841u of the first portion 841 of the connection element 84. A height of the second portion 822 of the connection element 82 is different from a height of the second portion 842 of the connection element 84 (e.g. is larger than about 1.1 times the height of the second portion 842, is larger than about 1.2 times the height of the second portion 842, or is larger than about 1.3 times the height of the second portion 842, or is smaller than about 0.9 times the height of the second portion 842, is smaller than about 0.8 times the height of the second portion 842, or is smaller than about 0.7 times the height of the second portion 842).

The protection layer 70 is disposed on the surface 801 of the patterned conductive layer 80. The protection layer 70 defines an opening 711 corresponding to the connection element 82. The protection layer 70 defines an opening 712 corresponding to the connection element 84. The side wall 711s of the opening 711 of the protection layer 70 surrounds a portion of the connection element 82. The first top surface 821u of the first portion 821 of the connection element 82 is lower than the top surface 701 of the protection layer 70.

Figure 5:
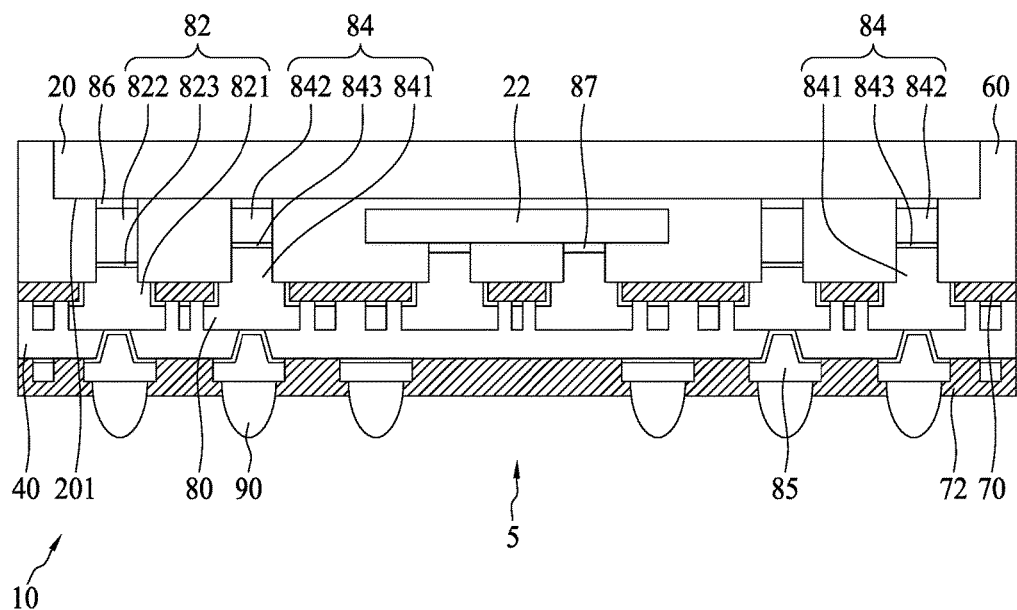
FIG. 5 is a cross-sectional view of a semiconductor package structure in accordance with one or more embodiments of the present disclosure.

FIG. 5 is a cross-sectional view of a semiconductor package structure 5 in accordance with one or more embodiments of the present disclosure. The semiconductor package structure 5 includes a semiconductor substrate 10, a molding material 60, chips 20 and 22 and solders 90 (e.g. solder elements, solder bumps, or solder balls).

The semiconductor substrate 10 is similar to the semiconductor substrate 1 shown in FIG. 1, and some same-numbered components are not described again with respect to FIG. 5. The semiconductor substrate 10 includes a dielectric layer 40, patterned conductive layers 80 and 85, connection elements 82 and 84 and protection layers 70 and 72. In some embodiments, the patterned conductive layers 80 and 85 and the connection element 84 and 82 may include, for example, Cu, another metal, a metal alloy, or other conductive material. In some embodiments, the protection layers 70 and 72 may be solder mask layers.

The connection element 82 includes a first portion 821, a second portion 822 and a seed layer 823 disposed between the first portion 821 and the second portion 822. The connection element 84 includes a first portion 841, a second portion 842 and a seed layer 843 disposed between the first portion 841 and the second portion 842. The first portion 821 of the connection element 82 and the patterned conductive layer 80 are formed to be a monolithic structure. The first portion 841 of the connection element 84 and the patterned conductive layer 80 are formed to be a monolithic structure. The chip 20 has an active surface 201. The chip 20 is disposed on the semiconductor substrate 10. The active surface 201 faces the semiconductor substrate 10 and is electrically connected to the connection element 82. The chip 22 is disposed between the connection element 82 and the connection element 84 and electrically connected to the patterned conductive layer 80. The molding material 60 encapsulating the chip 20, the chip 22 and the substrate 10. In some embodiments, the molding material 60 includes a suitable insulating material. Top surfaces of the connection element 82 and 84 are substantially coplanar with each other, which may provide for miniaturization of the semiconductor package structure 5 (e.g. by omitting additional solder ball structures for reliable electrical connection). The coplanar connection element 82 and 84 may help to avoid poor electrical connection of the chips 20 and 22.

Figure 6A:
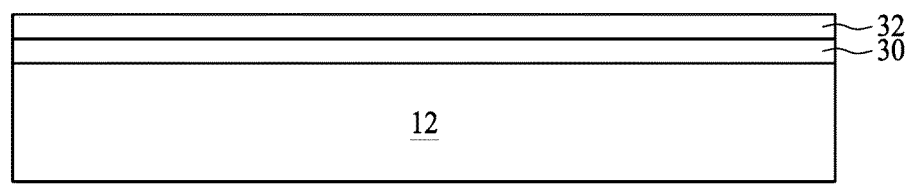
FIG. 6A, FIG. 6B, FIG. 6C, FIG. 6D, FIG. 6E, FIG. 6F, FIG. 6G, FIG. 6H, FIG. 6I, and FIG. 6J illustrate one or more embodiments of a method of manufacturing the semiconductor substrate shown in FIG. 1.

FIG. 6A through FIG. 6J illustrate one or more embodiments of a method of manufacturing the semiconductor substrate 1 shown in FIG. 1. Referring to FIG. 6A, a carrier 12 is provided. A release layer 30 is disposed on the carrier 12. In some embodiments, the release layer 30 may include a Cu foil and/or an adhesive layer. A layer 32 is disposed on the release layer 30. In some embodiments, the layer 32 may be a metal layer (e.g. a Cu layer) or a seed layer having a thickness in a range from about 3 µm to about 5 µm.

Figure 6B:
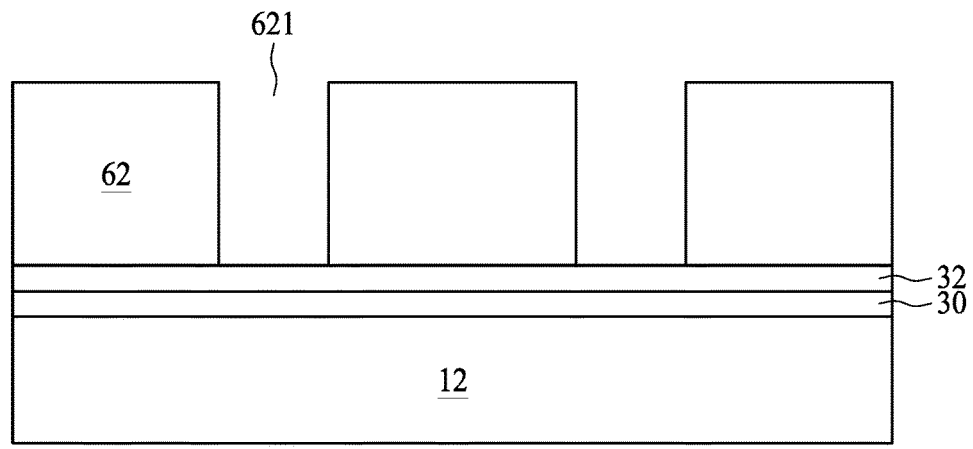

Referring to FIG. 6B, a patterned photo resist layer 62 is disposed or formed on the layer 32. The patterned photo resist layer 62 has openings 621 formed therein.

Figure 6C:
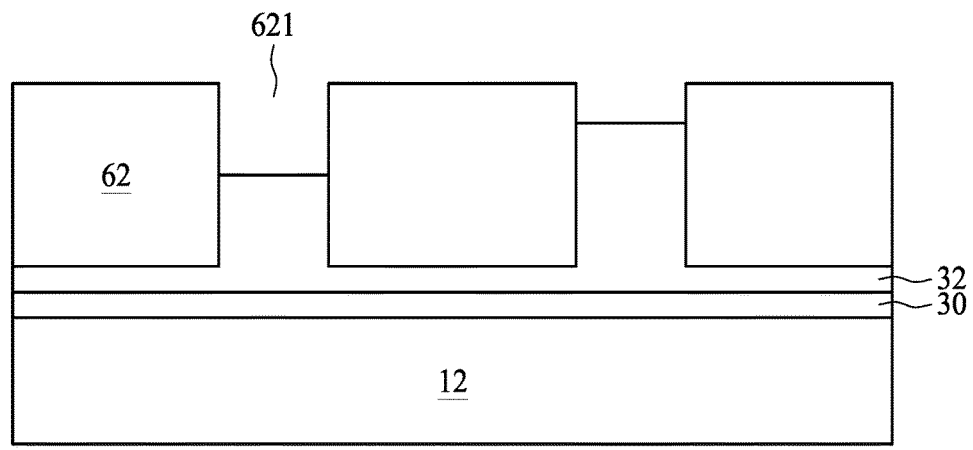

Referring to FIG. 6C, a first plating operation is performed on the layer 32. The plating rates of the layer 32 in each one of the openings 621 may be different (e.g. a plating rate for one of the openings 621 may be about 1.1 times or more that of another of the openings 621, may be about 1.2 times or more that of another of the openings 621, or may be about 1.3 times or more that of another of the openings 621). The plating rates at the openings 621 in which higher density material is disposed may be lower than the plating rates at the openings 621 in which lower density material is disposed. The first plating operation may use a relatively inexpensive plating solution (e.g. omitting levelers and/or brighteners). Thus, use of a relatively high cost plating solution (e.g. which includes levelers and/or brighteners) can be minimized.

Figure 6D:
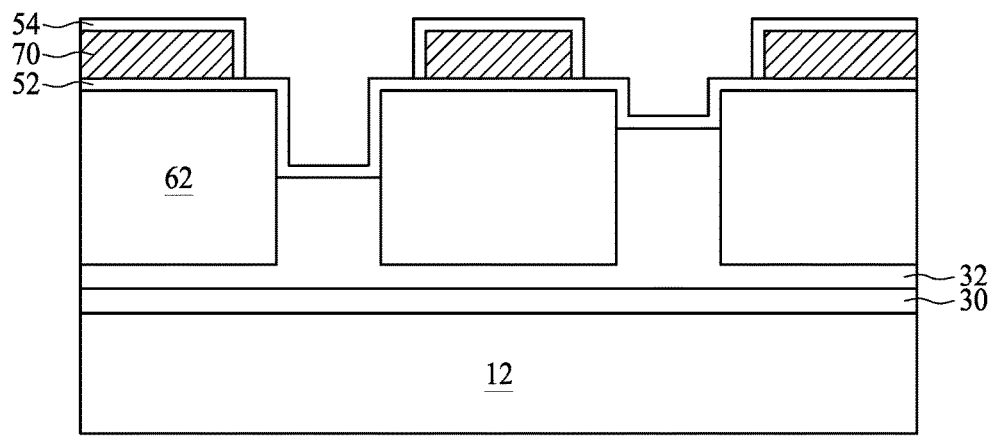

Referring to FIG. 6D, a seed layer 52 is disposed on an exposed portion of the patterned photo resist layer 62 and the layer 32. In some embodiments, each of the plating heights of the layer 32 in the openings 621 is greater than about 100 µm (e.g. may be about 110 µm or greater, about 120 µm or greater, or about 130 µm or greater). In some embodiments, the seed layer 52 may include, for example, Cu, another metal, a metal alloy, or other conductive material. The patterned protection layer 70 is disposed on the seed layer 52. In some embodiments, the protection layer 70 may be a solder mask layer. A seed layer 54 is disposed on an exposed portion of the patterned protection layer 70.

Figure 6E:
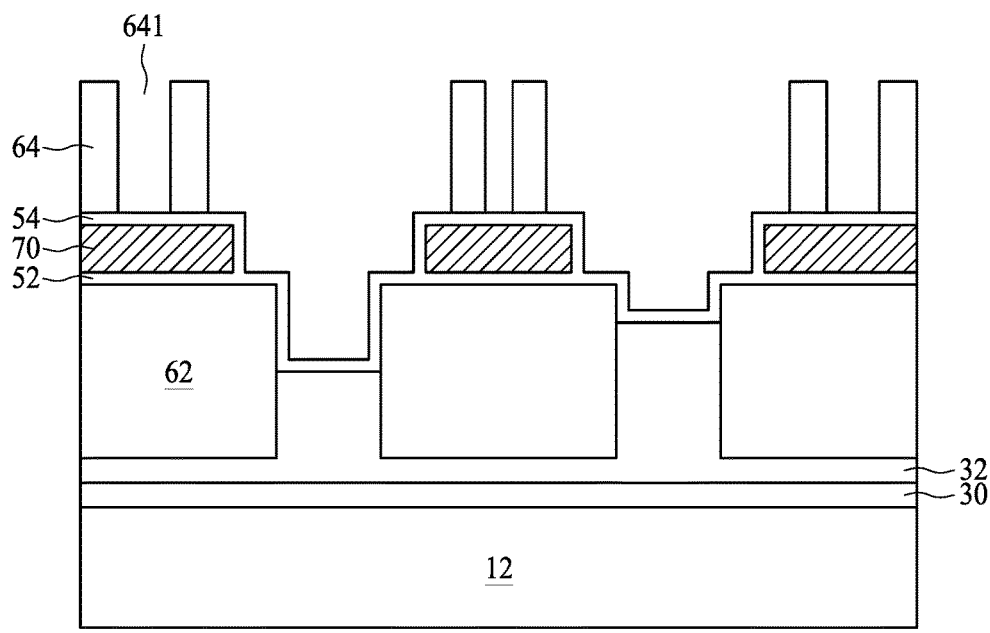

Referring to FIG. 6E, a patterned photo resist layer 64 is disposed on the seed layer 54. The patterned photo resist layer 64 has openings 641 formed therein.

Figure 6F:
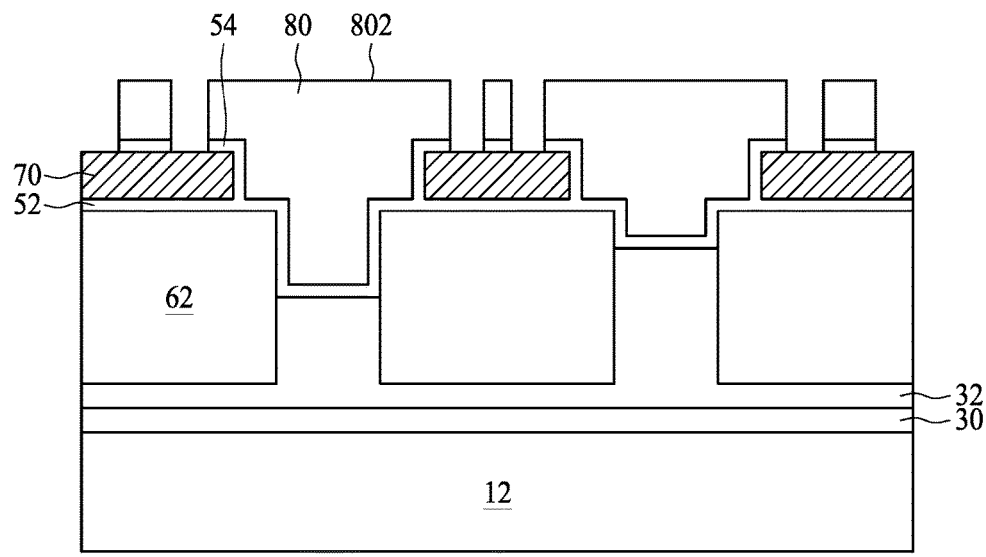

Referring to FIG. 6F, a second plating operation is performed on the seed layer 54. The second plating operation of forming the patterned conductive layer 80 may use a plating solution having levelers and/or brighteners, which is relatively expensive. Using two different plating operations (first and second operations) may help to avoid voids forming in the connection elements 82 and 84 (not shown). The plating rates of the layer 32 in each one of the openings 621 are different (e.g. a plating rate for one of the openings 621 may be about 1.1 times or more that of another of the openings 621, may be about 1.2 times or more that of another of the openings 621, or may be about 1.3 times or more that of another of the openings 621). The plating rates at openings 621 in which higher density material is disposed may be lower than the plating rates at the openings 621 in which lower density material is disposed. The second plating operation is ended when surfaces 802 (e.g. top surfaces) of the patterned conductive layer 80 are substantially coplanar with one another. Next, the patterned photo resist layer 64 is removed. The second plating operation further comprises using a fill chemical, wherein the fill chemical includes levelers and/or brightener so that a deep position in one of the openings 641 (a portion of a material disposed in the one of the openings 641 having a relatively low top surface) has a higher plating rate than a shallow position in the one of the openings 641 (a portion of a material disposed in the one of the openings 641 having a relatively high top surface).

Performing a first plating operation using a plating solution (e.g. omitting levelers and/or brighteners) to form a second portion 822 (corresponding to the layer 32) may help to avoid voids because such a plating solution (e.g. omitting levelers and/or brighteners) may lead to a relatively slow formation of the second portion 822 (corresponding to the layer 32). Using a plating solution (e.g. omitting levelers and/or brighteners) during a first plating operation may lead to a relatively slow formation of the connection elements, such that the height difference along the layer 32 may be reduced. The seed layers 52 and 54 provide a relatively large plating area and may compensate for a height difference (e.g. may result in a relatively planar final surface) between the different protrusions of the layer 32 (disposed in different openings 621). In addition, the second plating operation, by using the plating solution including levelers and/or brighteners, may further help to compensate for the height difference.

Figure 6G:
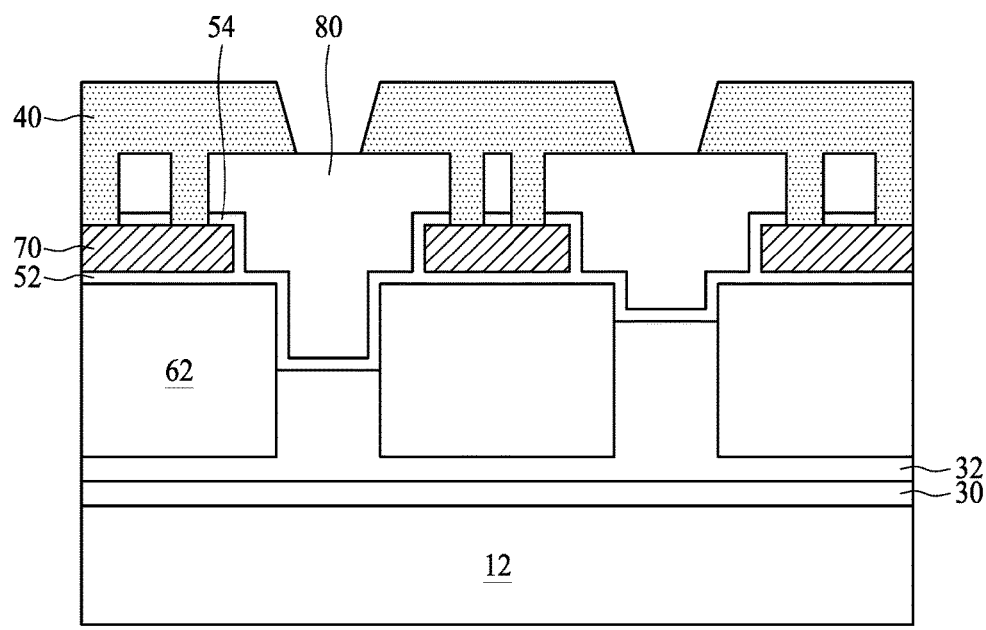

Referring to FIG. 6G, a dielectric layer 40 is disposed on the patterned conductive layer 80. The dielectric layer 40 has openings formed therein.

Figure 6H:
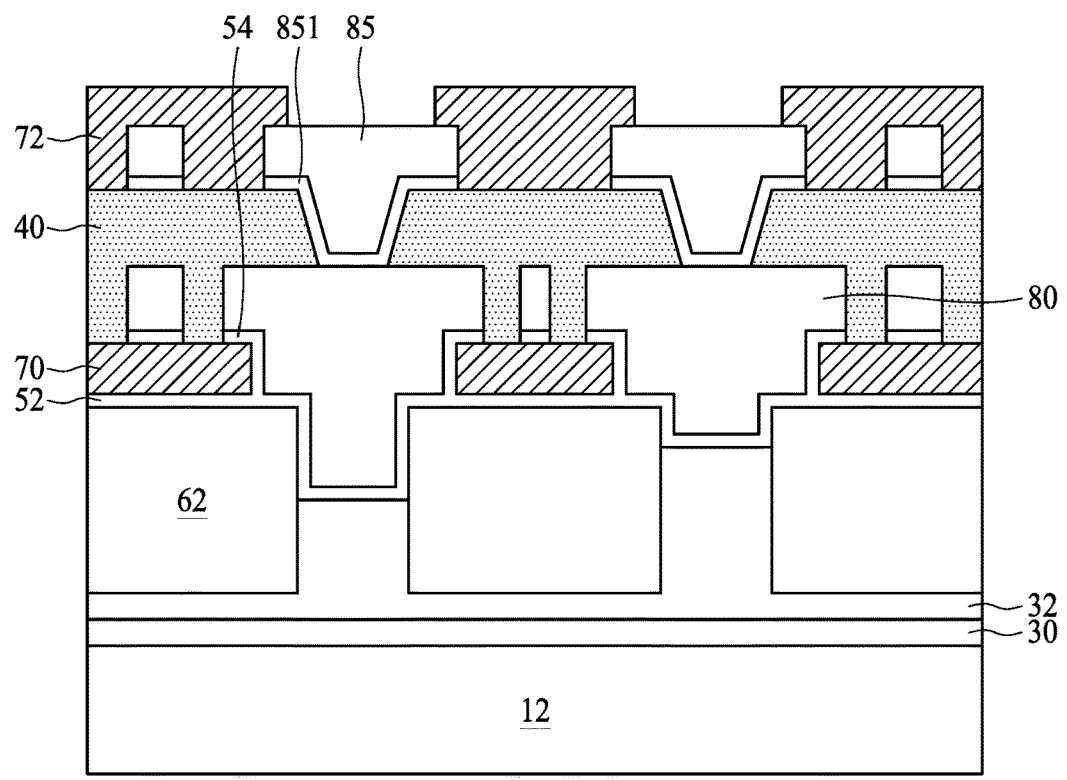

Referring to FIG. 6H, a seed layer 851 and a patterned conductive layer 85 are formed on the patterned conductive layer 80. A protection layer 72 is formed on the dielectric layer 40 and covers a portion of the patterned conductive layer 85. In some embodiments, the protection layer 72 may be a solder mask layer.

Figure 6I:
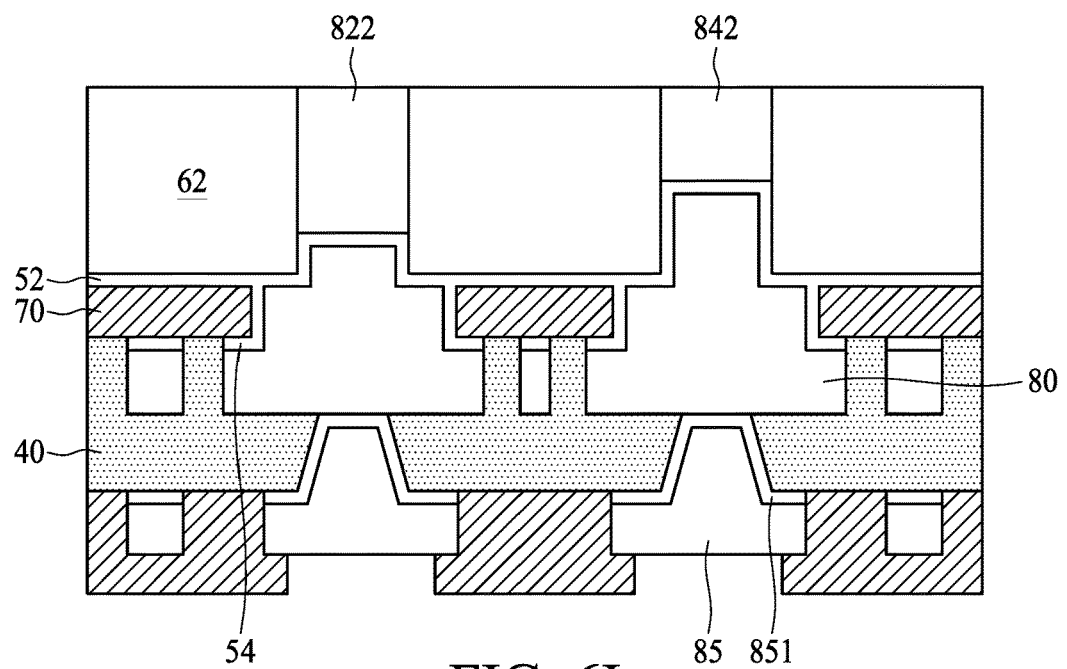

Referring to FIG. 6I, the carrier 12 and the release layer 30 are removed. A portion of the layer 32 is removed until the surface of the patterned photo resist layer 62 is exposed. The connection element 82 which includes a first portion 821, a second portion 822 and a seed layer 823 is obtained. The connection element 84 which includes a first portion 841, a second portion 842 and a seed layer 843 is obtained.

Figure 6J:
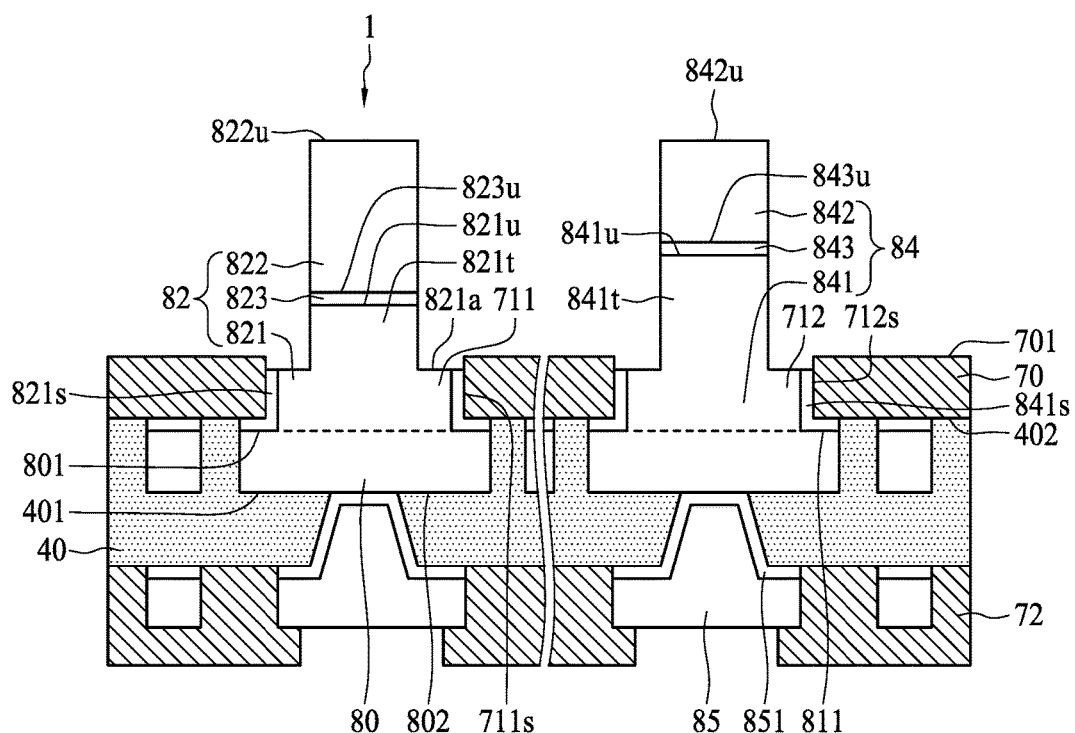

Referring to FIG. 6J, the patterned photo resist layer 62 is removed. Next, the seed layer 52 is removed. Since the removing operation of the seed layer 52 is performed by over etching, the second upper surface 821a of the first portion 821 of the connection element 82 is lower than the top surface 701 of the protection layer 70. After etching, the semiconductor substrate 1 shown in FIG. 1 is obtained.

Figure 7A:
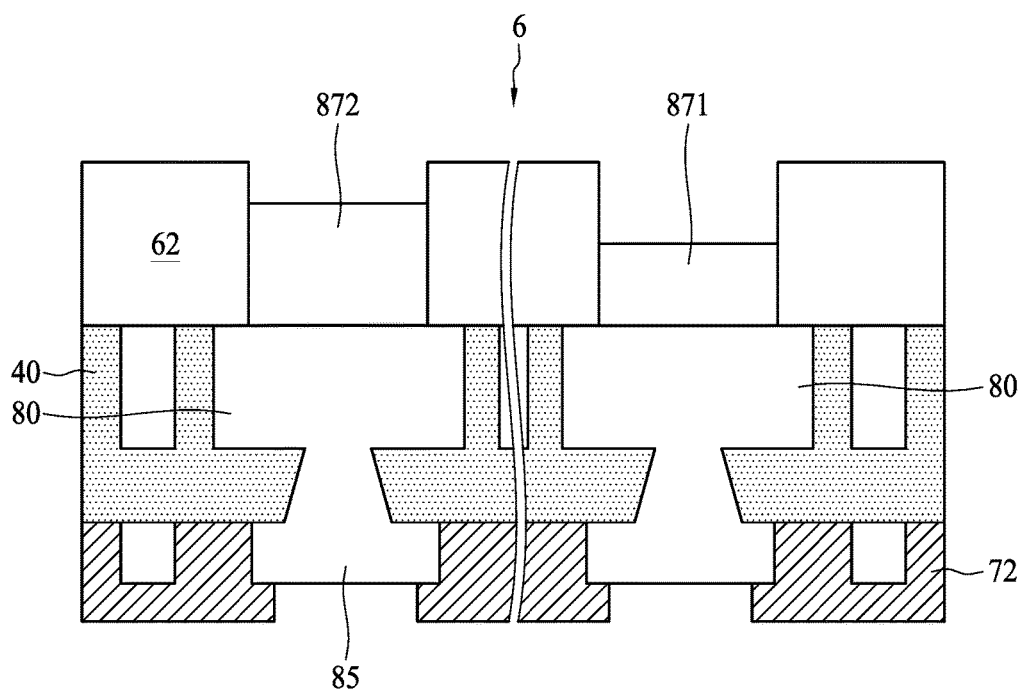
FIG. 7A illustrates a semiconductor substrate in accordance with one or more embodiments of the present disclosure.

FIG. 7A illustrates one or more embodiments of a semiconductor substrate 6. The semiconductor substrate 6 includes a dielectric layer 40, patterned conductive layers 80 and 85, connection elements 871 and 872 and a protection layer 72. The plating rates of the connection elements 872 are higher than the plating rates of the connection elements 871. The density of the connection elements 871 is higher than the density of the connection elements 872 (e.g. is higher by a factor of about 1.1 or more, of about 1.2 or more, or of about 1.3 or more). The plating operation for connection elements 871 and 872 may use a relatively inexpensive plating solution (e.g. omitting levelers and/or brighteners).

Figure 7B:
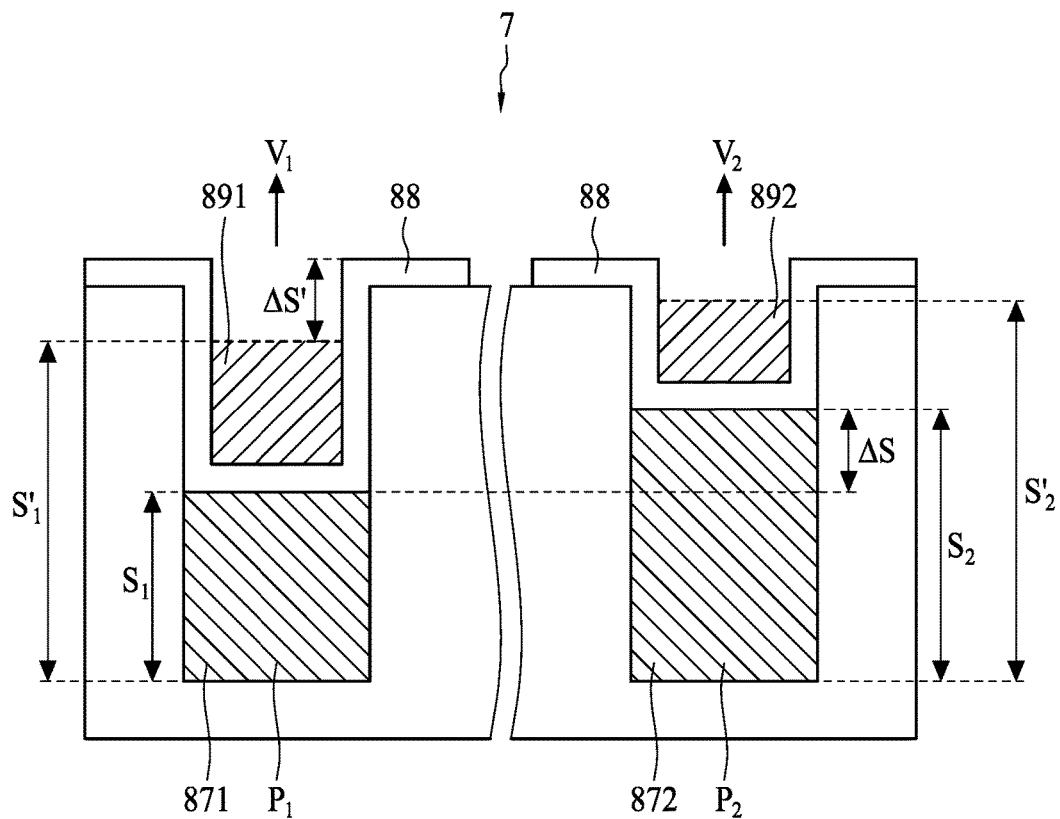
FIG. 7B illustrates a semiconductor substrate in accordance with one or more embodiments of the present disclosure.

FIG. 7B illustrates one or more embodiments of a semiconductor substrate 7. The semiconductor substrate 7 includes a dielectric layer 40, patterned conductive layers 80 and 85, connection elements 82 and 84 and protection layers 70 and 72. Some equations relating and/or specifying parameters $S_1'$, $S_2'$ and $\Delta S'$ is as follow.

$$S_2' = S_1' + \Delta S' \quad (1)$$

$$V_1 > V_2 \quad (2)$$

$$S_1' = S_1 + V_1 \times \Delta t \quad (3)$$

$$S_2' = S_2 + V_2 \times \Delta t \quad (4)$$

$$\Delta S' = S_2' - S_1' = S_2 + V_2 \times \Delta t - (S_1 + V_1 \times \Delta t) = \Delta S + (V_2 - V_1) \quad (5)$$

The parameter $S_1$ is an original height of a connection element 891 formed in an opening P1. The parameter $S_2$ is an original height of a connection element 892 formed in an opening P2. The parameter $S_1'$ is a final height of the connection element 891 formed in the opening P1. The parameter $S_2'$ is a final height of the connection element 892 formed in the opening P2. The parameter $\Delta S'$ is the difference between the parameter $S_2'$ and the parameter $S_1'$. The parameter $V_1$ is the plating rate for forming the connection elements 891 in the opening P1. The parameter $V_2$ is the plating rate for forming the connection elements 892 in the opening P2. The parameter $\Delta t$ is the time for performing the plating operation in the openings P1 and P2.

The plating rate $V_1$ is greater than the plating rate $V_2$ (e.g. is greater by a factor of about 1.1 or more, is greater by a factor of about 1.2 or more, or greater by a factor of about 1.3 or more), since an area of the seed layer 88 for plating in opening P1 is greater than an area of the seed layer 88 for plating in opening P2 (e.g. is greater by a factor of about 1.1 or more, is greater by a factor of about 1.2 or more, or greater by a factor of about 1.3 or more). Since the plating rate $V_1$ is greater than the plating rate $V_2$, the parameter $\Delta S'$ will be lower than the parameter $\Delta S$ after the time $\Delta t$ is passed. The different areas of seed layer 88 in openings P1 and P1 may compensate for a height difference between the connection elements 891 and 892.

Figure 8A:
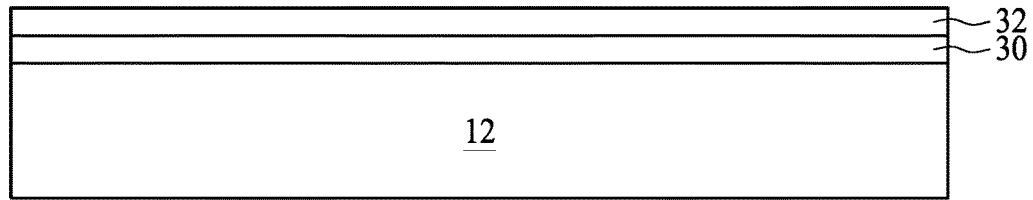
FIG. 8A, FIG. 8B, FIG. 8C, FIG. 8D, FIG. 8E, FIG. 8F, FIG. 8G, FIG. 8H, FIG. 8I, and FIG. 8J illustrate one or more embodiments of a method of manufacturing the semiconductor substrate shown in FIG. 2.

FIG. 8A through FIG. 8J illustrate one or more embodiments of a method of manufacturing the semiconductor substrate 2 shown in FIG. 2. Referring to FIG. 8A, a carrier 12 is provided. A release layer 30 is disposed on the carrier 12. In some embodiments, the release layer 30 may include a Cu foil and/or an adhesive layer. A layer 32 is disposed on the release layer 30. In some embodiments, the layer 32 may be a metal layer (e.g. a Cu layer) or a seed layer with a thickness ranging from about 3 μm to about 5 μm.

Figure 8B:
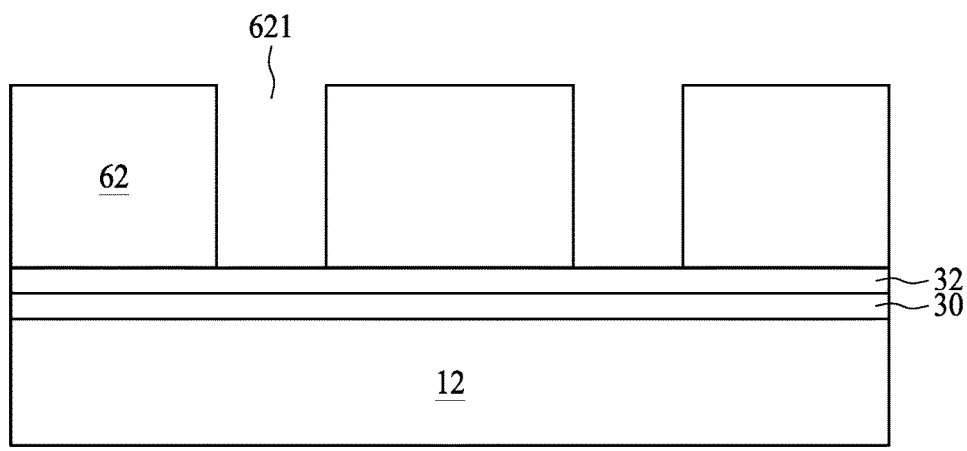

Referring to FIG. 8B, a patterned photo resist layer 62 is disposed on the layer 32. The patterned photo resist layer 62 has openings 621 formed therein.

Figure 8C:
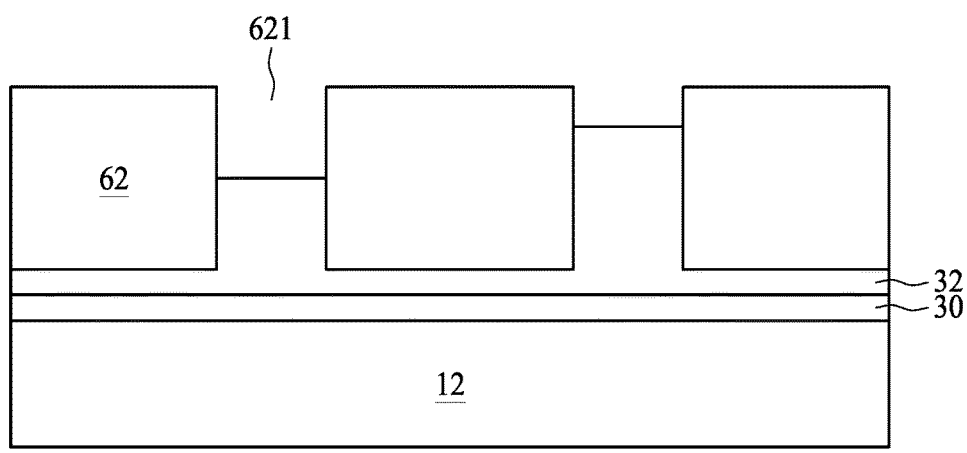

Referring to FIG. 8C, a first plating operation is performed on the layer 32. The plating rates of the layer 32 in each one of the openings 621 may be different (e.g. a plating rate for one of the openings 621 may be about 1.1 times or more that of another of the openings 621, may be about 1.2 times or more that of another of the openings 621, or may be about 1.3 times or more that of another of the openings 621). The plating rates at the openings 621 in which higher density material is disposed may be lower than the plating rates at the openings 621 in which lower density material is disposed. The first plating operation may use a relatively inexpensive plating solution (e.g. omitting levelers and/or brighteners). Thus, use of a relatively high cost plating solution (e.g. which includes levelers and/or brighteners) can be minimized.

Figure 8D:
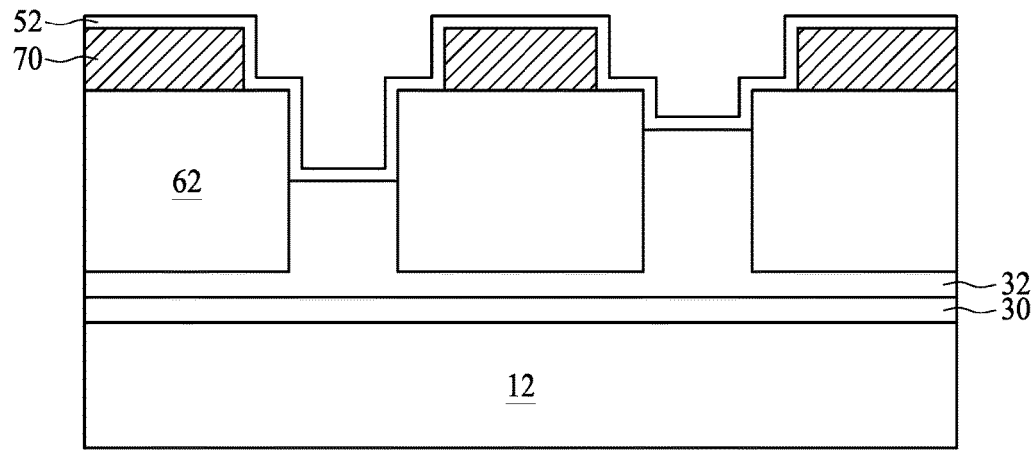

Referring to FIG. 8D, a patterned protection layer 70 is disposed on the patterned photo resist layer 62. In some embodiments, the protection layer 70 may be a solder mask layer. A seed layer 52 is disposed on the exposed portion of the protection layer 70, the side wall of the patterned photo resist layer 62 and the layer 32. In some embodiments, each of the plating height of the layer 32 is greater than about 100 µm (e.g. may be about 110 µm or greater, about 120 µm or greater, or about 130 µm or greater). In some embodiments, the seed layer 52 may include, for example, Cu, another metal, a metal alloy, or other conductive material.

Figure 8E:
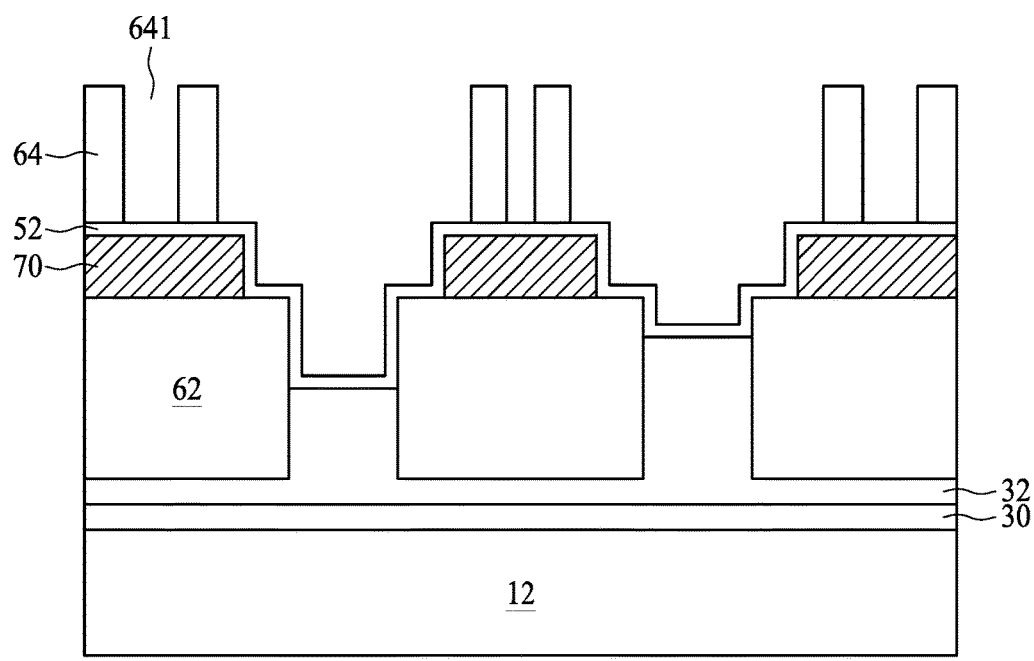

Referring to FIG. 8E, a patterned photo resist layer 64 is disposed on the seed layer 54. The patterned photo resist layer 64 has openings 641 formed therein.

Figure 8F:
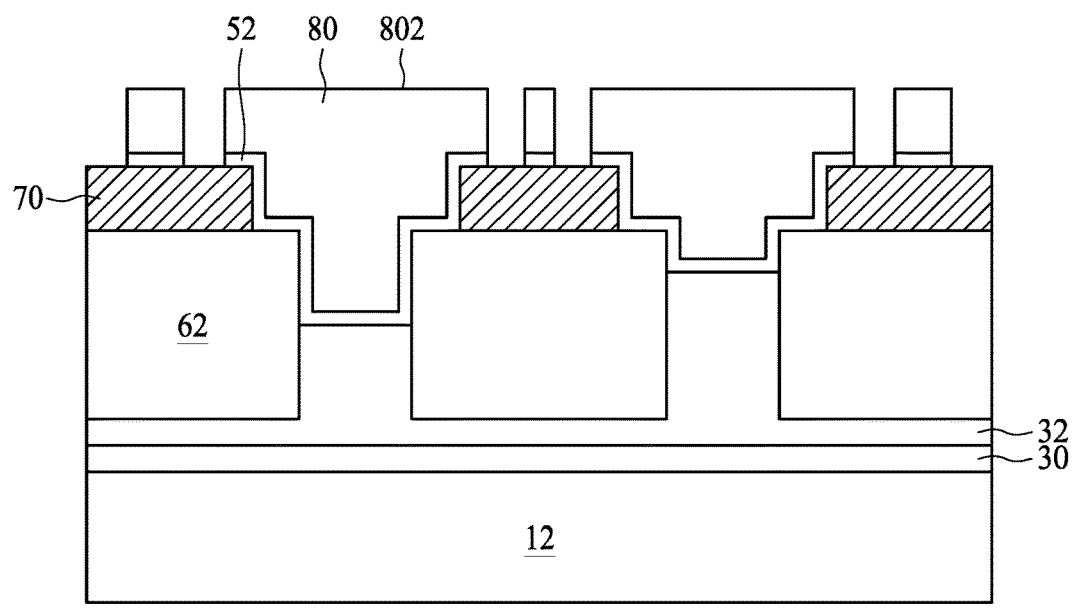

Referring to FIG. 8F, a second plating operation is performed on seed layer 52. The second plating operation of forming the patterned conductive layer 80 may use a plating solution having levelers and/or brighteners, which is relatively expensive. Using two different plating operations (first and second operations) may help to avoid voids formed in the connection elements 82 and 84 (not shown). The plating rates of the layer 32 in each one of the openings 621 may be different (e.g. a plating rate for one of the openings 621 may be about 1.1 times or more that of another of the openings 621, may be about 1.2 times or more that of another of the openings 621, or may be about 1.3 times or more that of another of the openings 621). The plating rates at the openings 621 in which higher density material is disposed may be lower than the plating rates at the openings 621 in which lower density material is disposed. The second plating operation is ended when surfaces 802 (e.g. top surfaces) of the patterned conductive layer 80 are substantially coplanar with one another. Next, the patterned photo resist layer 64 is removed. The second plating operation further comprises using a fill chemical, wherein the fill chemical includes levelers and/or brightener so that a deep position in one of the openings 641 (a portion of a material disposed in the one of the openings 641 having a relatively low top surface) has a higher plating rate than a shallow position in the one of the openings 641 (a portion of a material disposed in the one of the openings 641 having a relatively high top surface).

Figure 8G:
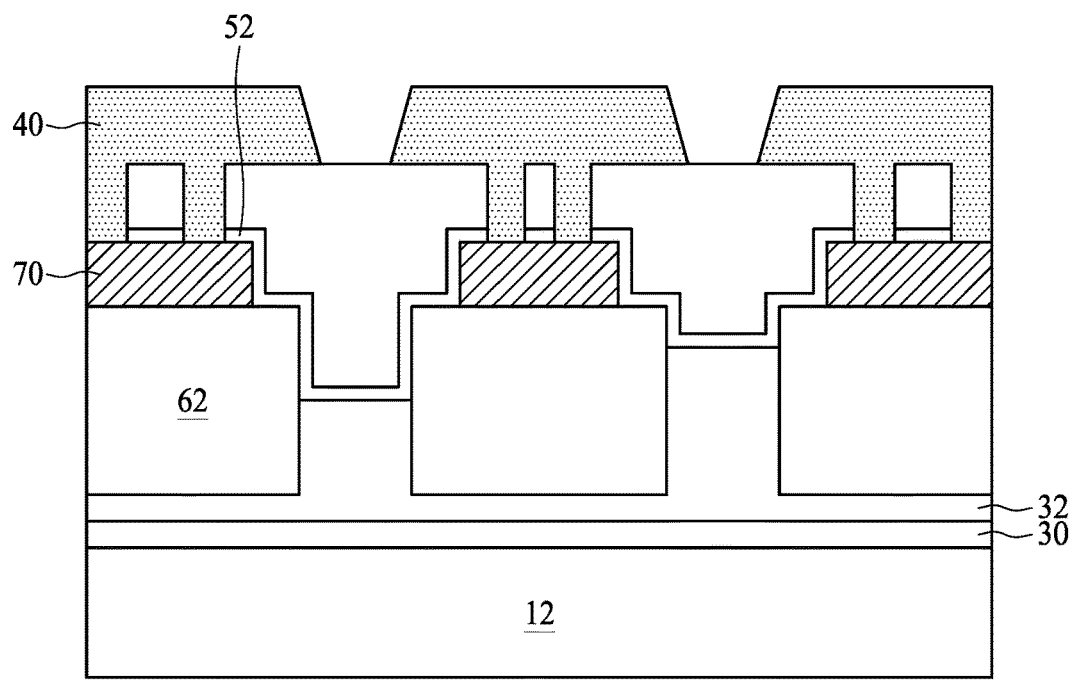

Referring to FIG. 8G, a dielectric layer 40 is disposed on the patterned conductive layer 80 and the protection layer 70. The dielectric layer 40 has openings formed therein.

Figure 8H:
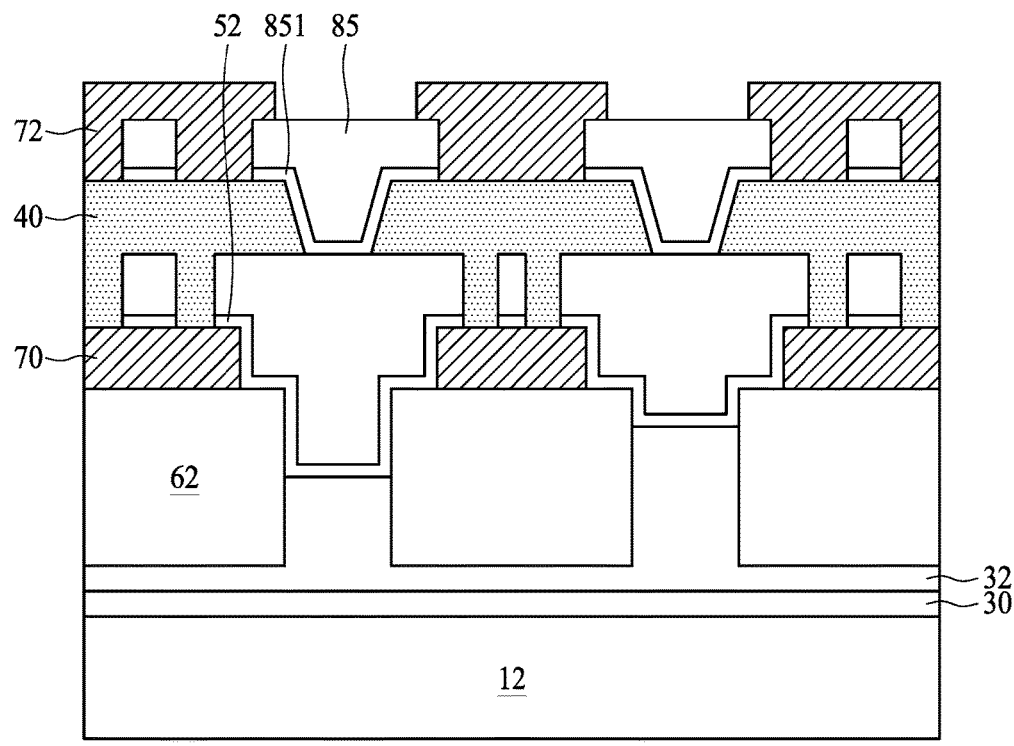

Referring to FIG. 8H, a seed layer 851 and a patterned conductive layer 85 are formed on the patterned conductive layer 80. A protection layer 72 is formed on the dielectric layer 40 and covers a portion of the patterned conductive layer 85. In some embodiments, the protection layer 72 may be a solder mask layer.

Figure 8I:
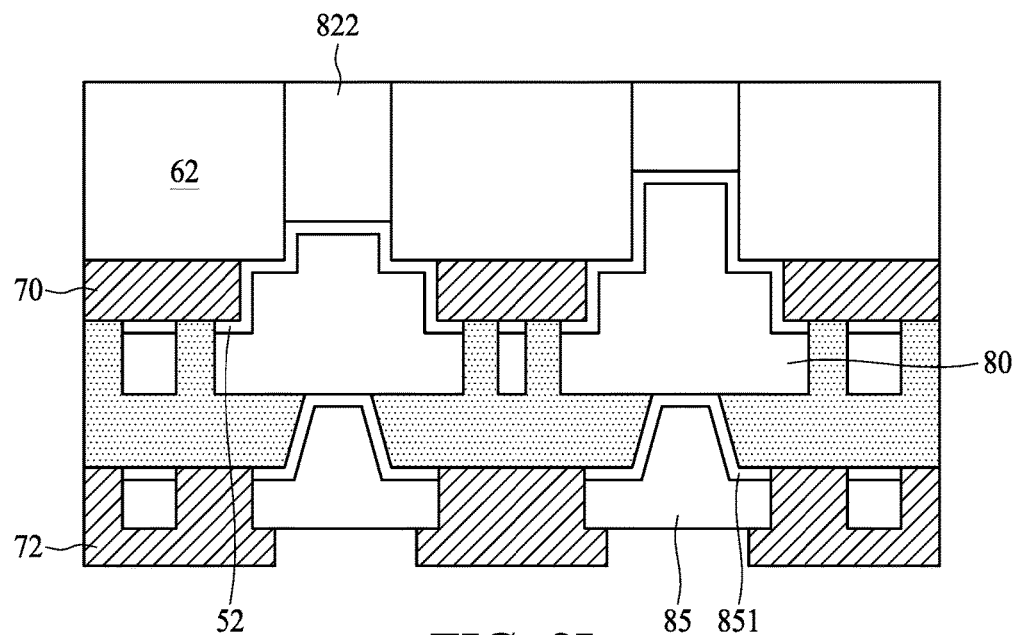

Referring to FIG. 8I, the carrier 12 and the release layer 30 are removed. A portion of the layer 32 is removed until the surface of the patterned photo resist layer 62 is exposed. The connection element 82 which includes a first portion 821, a second portion 822 and a seed layer 823 is obtained. The connection element 84 which includes a first portion 841, a second portion 842 and a seed layer 843 is obtained.

Figure 8J:
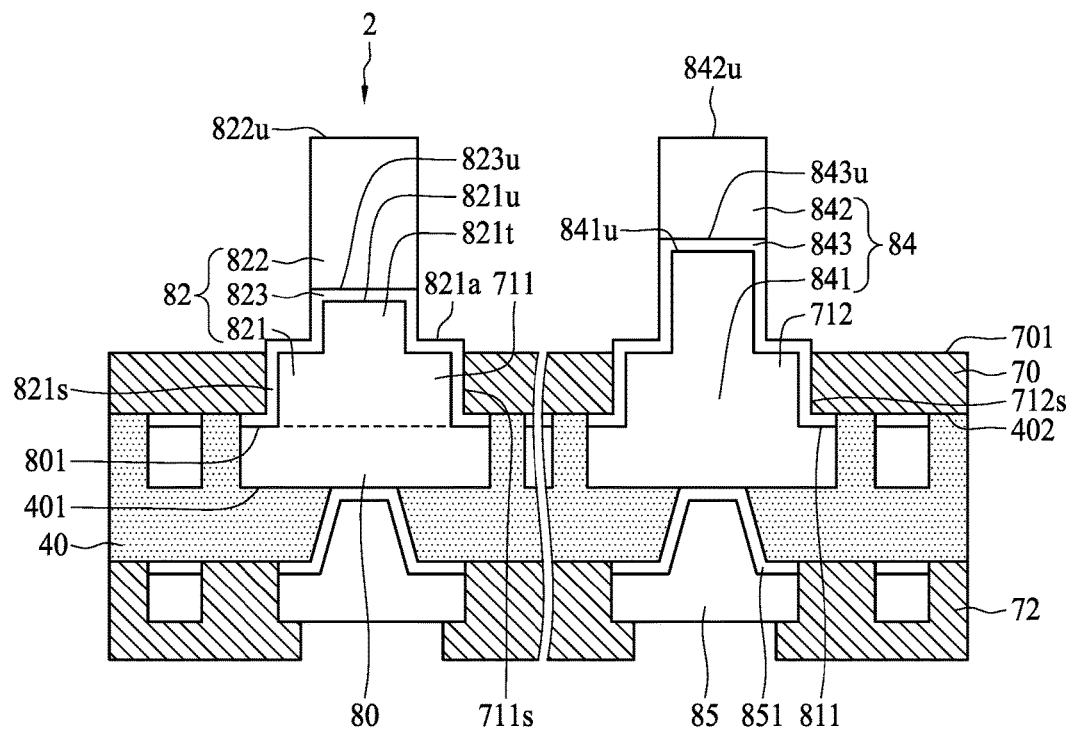

Referring to FIG. 8J, the patterned photo resist layer 62 is removed. Since the removing operation of the patterned photo resist layer 62 is performed by over etching, the second upper surface 821*a* of the first portion 821 of the connection element 82 is higher than the top surface 701 of the protection layer 70. After etching, the semiconductor substrate 2 shown in FIG. 2 is obtained.

Figure 9A:
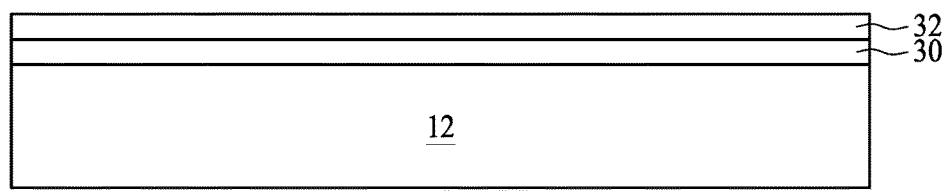
FIG. 9A FIG. 9B, FIG. 9C, FIG. 9D, FIG. 9E, FIG. 9F, FIG. 9G, FIG. 9H, FIG. 9I, and FIG. 9J illustrate one or more embodiments of a method of manufacturing the semiconductor substrate shown in FIG. 3.

FIG. 9A through FIG. 9J illustrate one or more embodiments of a method of manufacturing the semiconductor substrate 3 shown in FIG. 3. Referring to FIG. 9A, a carrier 12 is provided. A release layer 30 is disposed on the carrier 12. In some embodiments, the release layer 30 may include a Cu foil and an adhesive layer. A layer 32 is disposed on the release layer 30. In some embodiments, the layer 32 may be a metal layer (e.g. a Cu layer) or a seed layer having a thickness ranging from about 3 µm to about 5 µm.

Figure 9B:
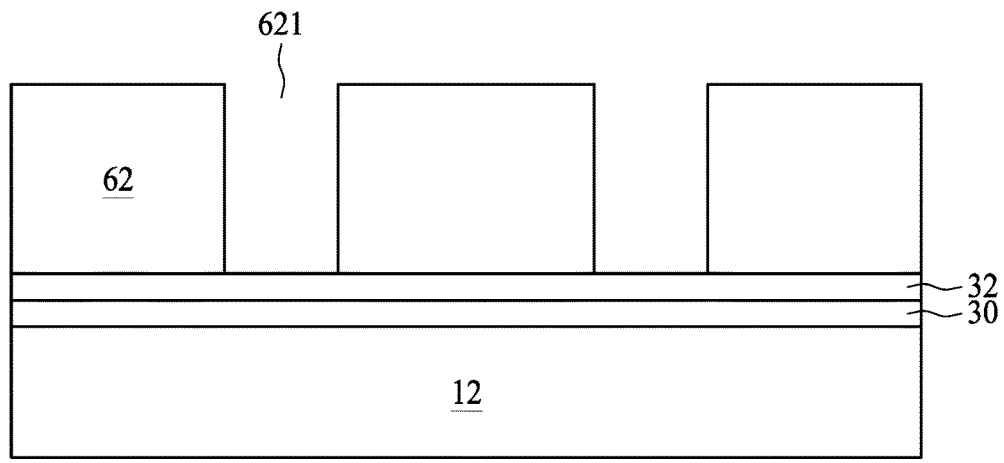

Referring to FIG. 9B, a patterned photo resist layer 62 is disposed on the layer 32. The patterned photo resist layer 62 has openings 621 formed therein.

Figure 9C:
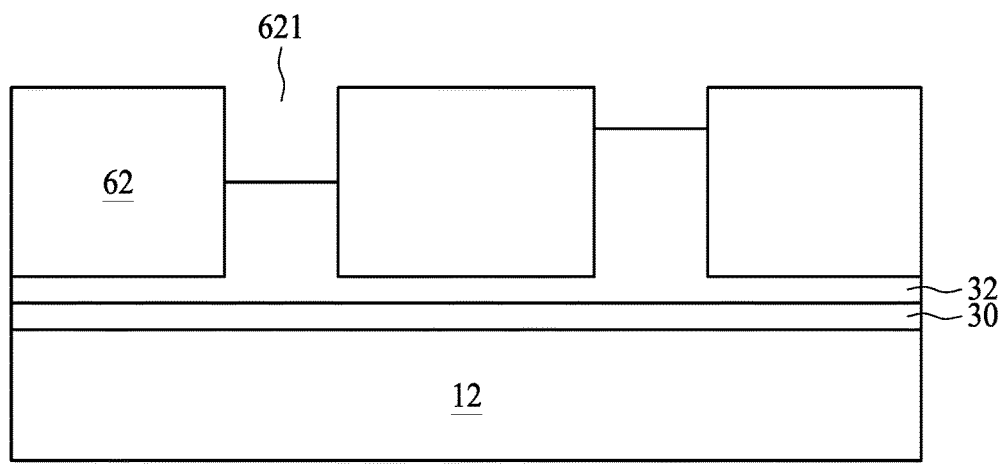

Referring to FIG. 9C, a first plating operation is performed on the layer 32. The plating rates of the layer 32 in each one of the openings 621 are different (e.g. a plating rate for one of the openings 621 may be about 1.1 times or more that of another of the openings 621, may be about 1.2 times or more that of another of the openings 621, or may be about 1.3 times or more that of another of the openings 621). The plating rates at the openings 621 in which higher density material is disposed may be lower than the plating rates at the openings 621 in which lower density material is disposed. The first plating operation may use a relatively inexpensive plating solution (e.g. omitting levelers and/or brighteners). Thus, use of a relatively high cost plating solution (which includes levelers and/or brighteners) can be minimized.

Figure 9D:
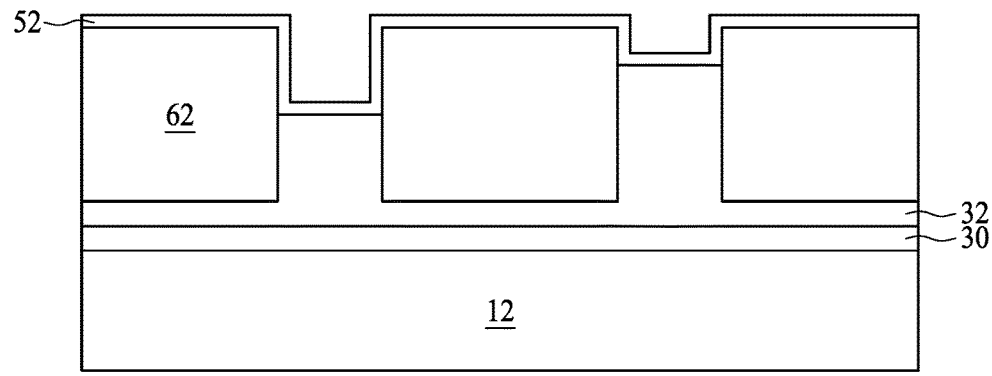

Referring to FIG. 9D, a seed layer 52 is disposed on the exposed portion of the patterned photo resist layer 62 and the layer 32. In some embodiments, each of the plating height of the layer 32 is greater than about 100 µm (e.g. may be about 110 µm or greater, about 120 µm or greater, or about 130 µm or greater). In some embodiments, the seed layer 52 may include, for example, Cu, another metal, a metal alloy, or other conductive material.

Figure 9E:
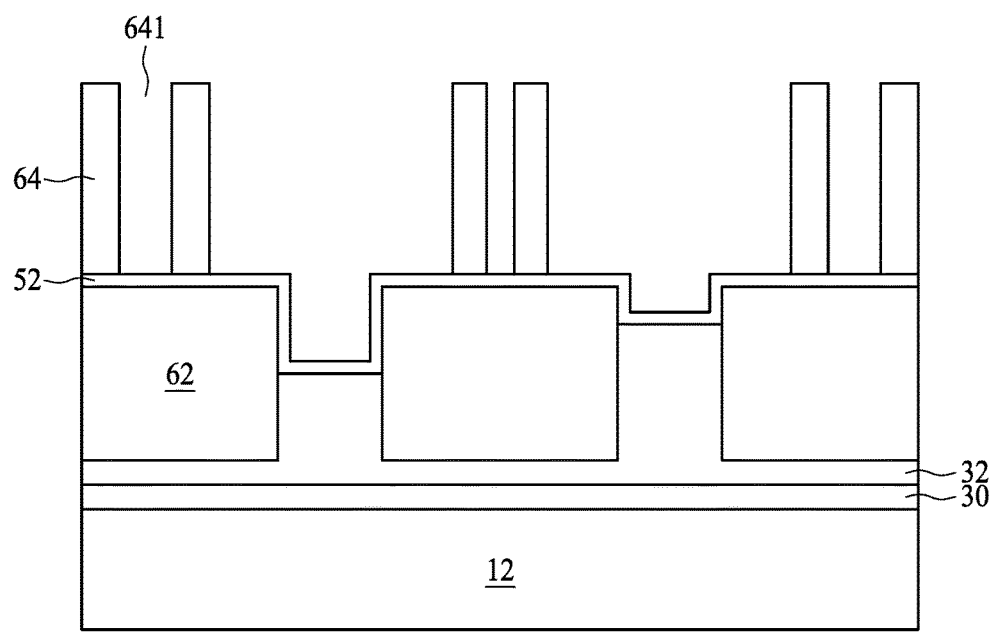

Referring to FIG. 9E, a patterned photo resist layer 64 is disposed on the seed layer 52. The patterned photo resist layer 64 has openings 621 formed therein.

Figure 9F:
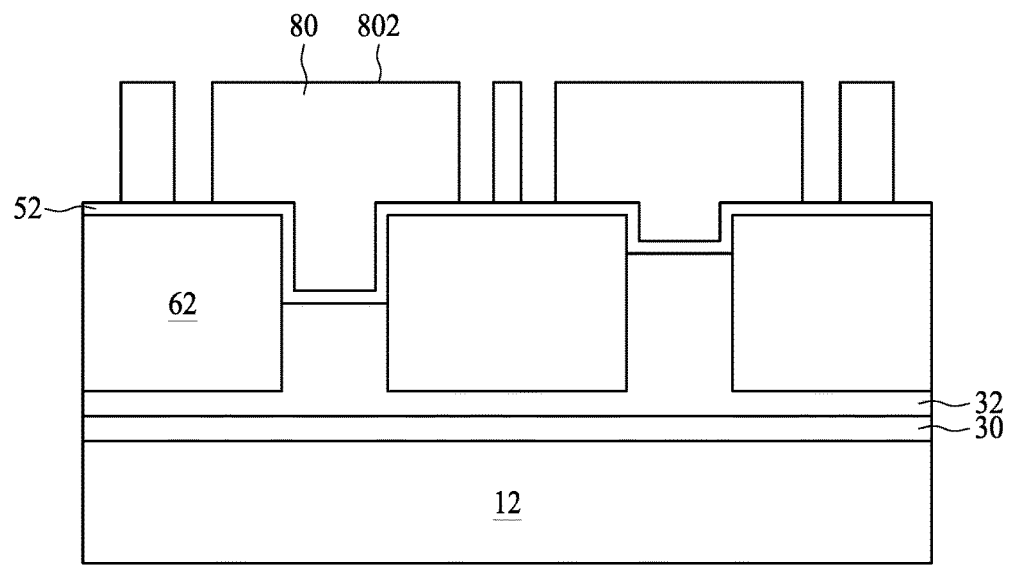

Referring to FIG. 9F, a second plating operation is performed on seed layer 52. The second plating operation of forming the patterned conductive layer 80 may use a plating solution having levelers and/or brighteners, which is relatively expensive. Using two different plating operations (first and second operations) may help to avoid voids formed in the connection elements 82 and 84 (not shown). The plating rates of the layer 32 in each one of the openings 621 may be different (e.g. a plating rate for one of the openings 621 may be about 1.1 times or more that of another of the openings 621, may be about 1.2 times or more that of another of the openings 621, or may be about 1.3 times or more that of another of the openings 621). The second plating operation is ended when the surfaces 802 of the patterned conductive layer 80 are substantially coplanar with one another. Next, the patterned photo resist layer 64 is removed. The second plating operation further comprises using a fill chemical, wherein the fill chemical includes levelers and/or brightener so that a deep position in one of the openings 641 (a portion of a material disposed in the one of the openings 641 having a relatively low top surface) has a higher plating rate than a shallow position in the one of the openings 641 (a portion of a material disposed in the one of the openings 641 having a relatively high top surface).

Figure 9G:
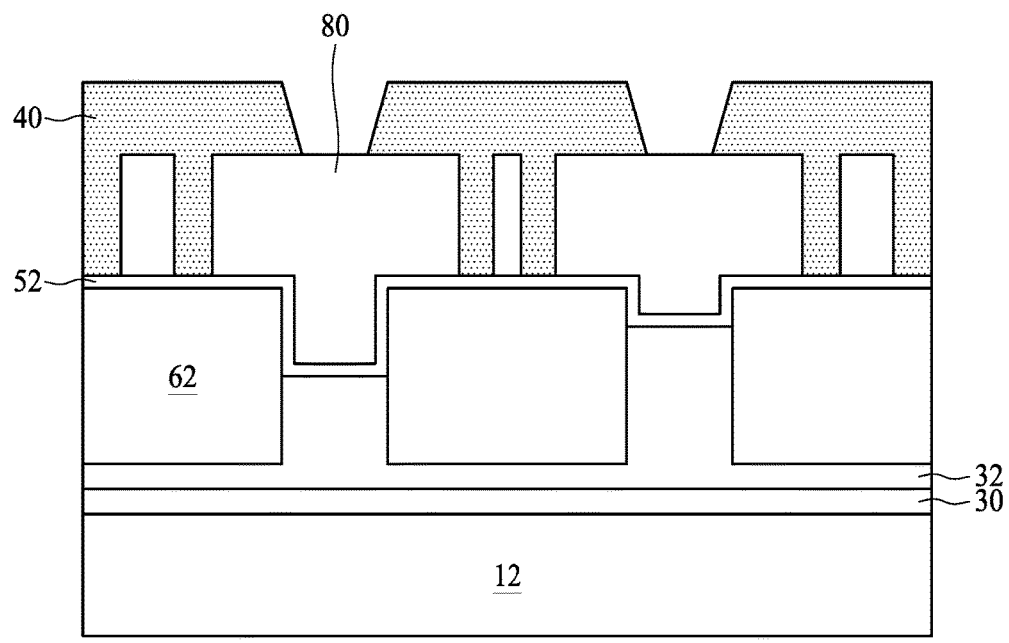

Referring to FIG. 9G, a dielectric layer 40 is disposed on the patterned conductive layer 80 and the patterned photo resist layer 62. The dielectric layer 40 has openings formed therein.

Figure 9H:
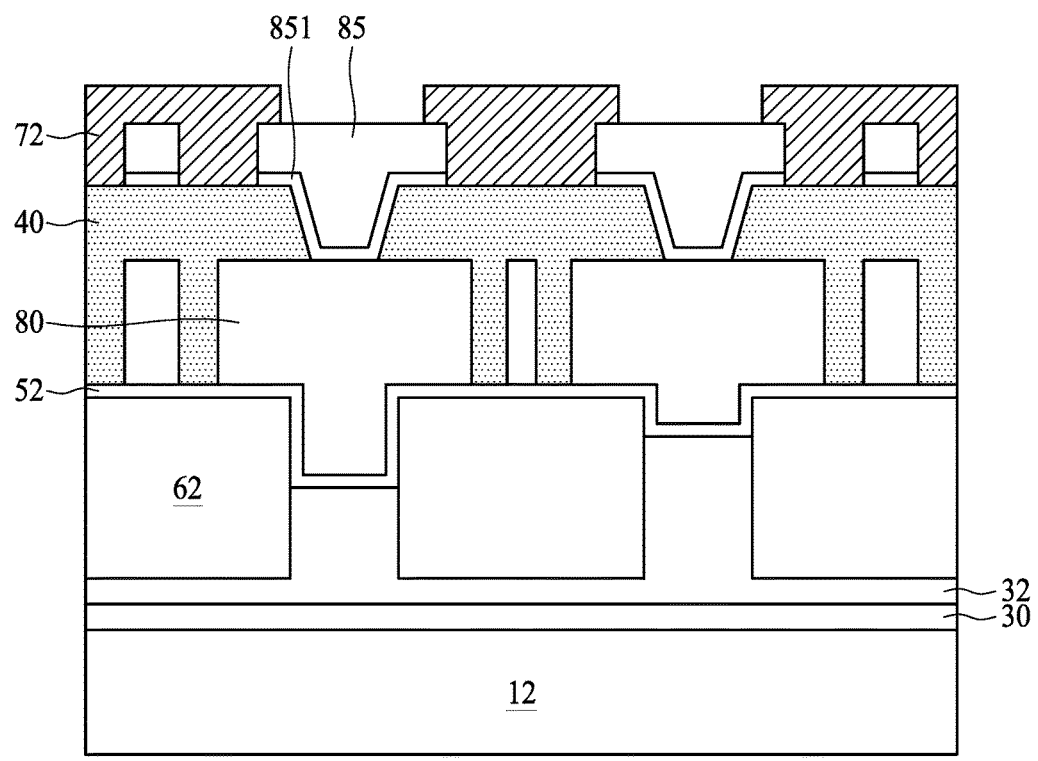

Referring to FIG. 9H, a seed layer 851 and a patterned conductive layer 85 are formed on the patterned conductive layer 80. A protection layer 72 is formed on the dielectric layer 40 and covers a portion of the patterned conductive layer 85. In some embodiments, the protection layer 72 may be a solder mask layer.

Figure 9I:
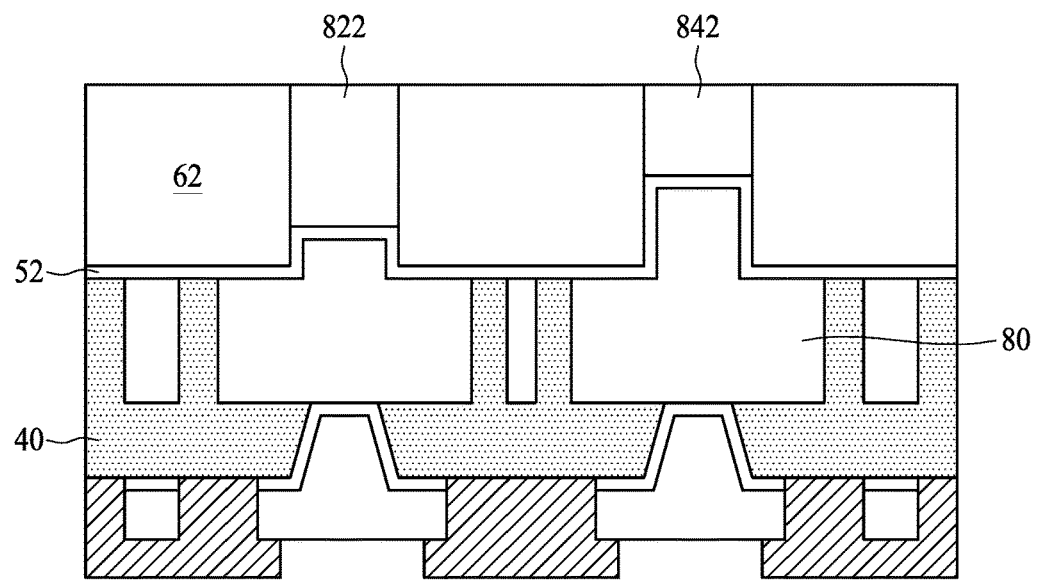

Referring to FIG. 9I, the carrier 12 and the release layer 30 are removed. A portion of the layer 32 is removed until the surface of the patterned photo resist layer 62 is exposed. The connection element 82 which includes a first portion 821, a second portion 822 and a seed layer 823 is obtained. The connection element 84 which includes a first portion 841, a second portion 842 and a seed layer 843 is obtained.

Figure 9J:
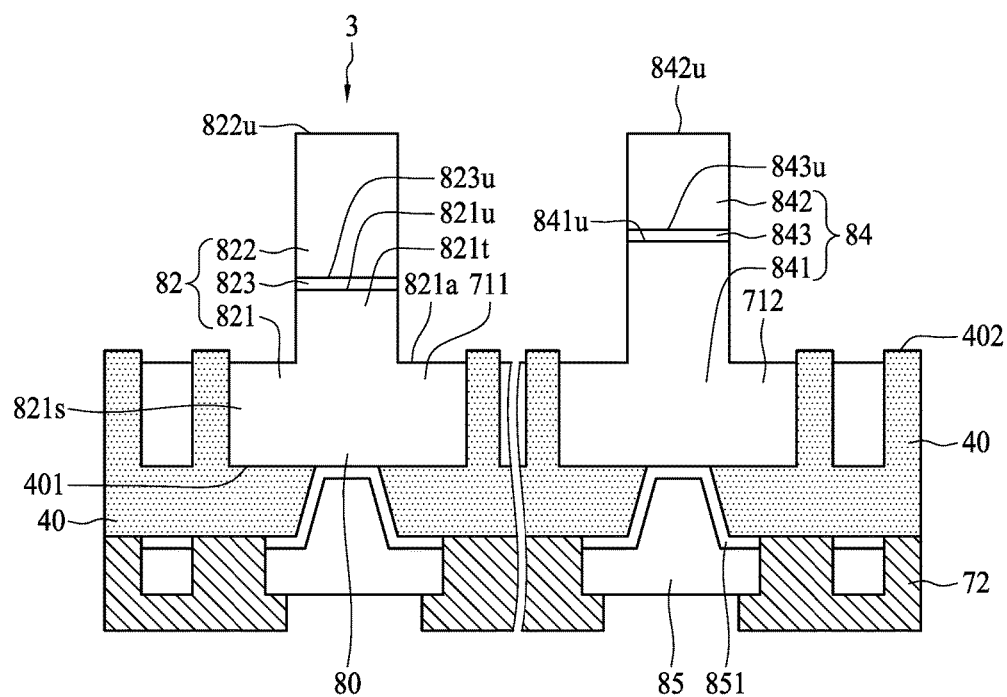

Referring to FIG. 9J, the patterned photo resist layer 62 is removed. Next, the seed layer 52 is removed. The removing operation of the seed layer 52 is performed by over etching. A portion of the first portion 821 is removed during the etching operation. After etching, the semiconductor substrate 3 shown in FIG. 3 is obtained.

A method of manufacturing the semiconductor substrate 4 shown in FIG. 4 can be similar to the method of manufacturing the semiconductor substrate 1 shown in FIG. 1, except for the operations shown in FIG. 6D. Referring to FIG. 6D, in some embodiments, the seed layer 52 above the layer 32 may be protruded from the patterned photo resist layer 62, if the layer 32 is higher than the top surface of the patterned photo resist layer 62. An arc shape of the first portion 821 (e.g. defined by a curved surface) of the connection element 82 shown in FIG. 4 is formed in this operation. In some embodiments, the position of the seed layer 52 above the layer 32 may be shallow in the openings 621 (e.g. may not protrude from the patterned photo resist layer 62). The recess 811r shown in FIG. 4 may thus be formed, and the recess 811r will be recessed in the surface 802 of the patterned conductive layer 80.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be substantially aligned or coplanar if a displacement between the two surfaces is no greater than 0.5 µm, no greater than 1 µm, no greater than 5 µm, no greater than 10 µm, or no greater than 15 µm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate, comprising:
   a dielectric layer having a first surface;
   a first patterned conductive layer having a first surface and disposed adjacent to the first surface of the dielectric layer; and
   a first connection element disposed on the first surface of the first patterned conductive layer, the first connection element comprising a first portion, a second portion and a seed layer disposed between the first portion and the second portion,
   wherein the first portion of the first connection element and the first patterned conductive layer are formed to be a monolithic structure.

2. The semiconductor substrate of claim 1, further comprising:
   a second connection element disposed on the first surface of the first patterned conductive layer, the second connection element comprising a first portion, a second portion and a seed layer disposed between the first portion and the second portion, wherein the first connection element has a top surface and the second connection element has a top surface, and wherein the second portion of the first connection element and the second portion of the second connection element protrude from the first surface of the dielectric layer and the top surface of the first connection element is substantially coplanar with the top surface of the second connection element.

3. The semiconductor substrate of claim 2, wherein the first portion of the first connection element has a first top surface and the first portion of the second connection element has a first top surface, and wherein the first portion of the first connection element and the first portion of the second connection element protrude from the first surface of the dielectric layer and the first top surface of the first portion of the first connection element is not coplanar with the first top surface of the first portion of the second connection element.

4. The semiconductor substrate of claim 3, wherein a height of the second portion of the first connection element is different from a height of the second portion of the second connection element.

5. The semiconductor substrate of claim 4, wherein the first portion of the first connection element comprises a protrusion, wherein a width of the protrusion is substantially the same as a width of the second portion of the first connection element, and wherein a height of the protrusion of the first portion of the first connection element is less than the width of the protrusion of the first portion of the first connection element.

6. The semiconductor substrate of claim 3, further comprising a protection layer disposed on the first surface of the first patterned conductive layer, wherein the protection layer comprises an opening corresponding to the first connection element, and a side wall of the opening of the protection layer surrounds a portion of the first connection element.

7. The semiconductor substrate of claim 6, wherein the first connection element further comprises a seed layer disposed between the side wall of the opening of the protection layer and the first portion of the first connection element.

8. The semiconductor substrate of claim 7, wherein the first portion of the first connection element has a second top surface, wherein the second top surface of the first portion of the first connection element is lower than the first top surface of the first portion of the first connection element and is not coplanar with a top surface of the protection layer.

9. The semiconductor substrate of claim 8, wherein the top surface of the protection layer is lower than the second top surface of the first portion of the first connection element.

10. The semiconductor substrate of claim 8, wherein the dielectric layer further has a second surface higher than the first surface of the dielectric layer, wherein the second top surface of the first portion of the first connection element is lower than the second surface of the dielectric layer.

11. The semiconductor substrate of claim 7, wherein the first top surface of the first portion of the first connection element is lower than a top surface of the protection layer.

12. The semiconductor substrate of claim 2, wherein the first patterned conductive layer further has a second surface opposite to the first surface of the first patterned conductive layer, and a recess is recessed in the second surface of the first patterned conductive layer and a portion of the dielectric layer is disposed in the recess.

13. The semiconductor substrate of claim 2, wherein a length of a pitch between the first connection element and the second connection element is in a range from 150 µm to 200 µm.

14. The semiconductor substrate of claim 1, wherein a height of the first connection element is greater than 100 µm.

15. A semiconductor package structure, comprising:
a substrate, comprising:
a dielectric layer having a first surface;
a first patterned conductive layer having a first surface and disposed adjacent to the first surface of the dielectric layer; and
a first connection element disposed on the first surface of the first patterned conductive layer, the first connection element comprising a first portion, a second portion and a seed layer disposed between the first portion and the second portion,
wherein the first portion of the first connection element and the first patterned conductive layer are formed to be a monolithic structure; and
a first chip having an active surface and disposed on the substrate, wherein the active surface faces the substrate and is electrically connected to the first connection element.

16. The semiconductor package structure of claim 15, further comprising:
a second connection element disposed on the first surface of the first patterned conductive layer, the second connection element comprising a first portion, a second portion and a seed layer disposed between the first portion and the second portion; and
a second chip, wherein the second chip is disposed between the first connection element and the second connection element and electrically connected to the first patterned conductive layer.

17. The semiconductor package structure of claim 16, further comprising a molding material encapsulating the first chip, the second chip and the substrate.

18. The semiconductor package structure of claim 16, wherein the first connection element has a top surface and the second connection element has a top surface, and wherein the top surface of the first connection element is substantially coplanar with the top surface of the second connection element.

19. The semiconductor package structure of claim 16, wherein a height of the second portion of the first connection element is different from a height of the second portion of the second connection element.

20. The semiconductor package structure of claim 16, wherein a length of a pitch between the first connection element and the second connection element is in a range from 150 µm to 200 µm.

* * * * *